United States Patent
Kim et al.

(10) Patent No.: US 11,651,201 B2
(45) Date of Patent: May 16, 2023

(54) MEMORY DEVICE INCLUDING ARITHMETIC CIRCUIT AND NEURAL NETWORK SYSTEM INCLUDING THE SAME

(71) Applicant: SAMSUNG ELECTRONICS CO., LTD., Suwon-si (KR)

(72) Inventors: Chan-Kyung Kim, Hwaseong-si (KR); Soon-Young Kim, Hwaseong-si (KR); Jin-Min Kim, Seoul (KR); Jae-Hong Min, Yongin-si (KR); Sang-Kil Lee, Seongnam-si (KR); Young-Nam Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 928 days.

(21) Appl. No.: 16/522,920

(22) Filed: Jul. 26, 2019

(65) Prior Publication Data

US 2020/0160157 A1    May 21, 2020

(30) Foreign Application Priority Data

Nov. 16, 2018    (KR) .................. 10-2018-0141950

(51) Int. Cl.
  *G11C 16/08*    (2006.01)
  *G06N 3/063*    (2023.01)
  *G06F 9/30*    (2018.01)
  *G06F 7/544*    (2006.01)

(52) U.S. Cl.
  CPC ........... *G06N 3/063* (2013.01); *G06F 7/5443* (2013.01); *G06F 9/30105* (2013.01); *G11C 16/08* (2013.01)

(58) Field of Classification Search
  CPC ................. G06N 3/063; G06F 7/5443; G06F 9/30105; G11C 16/08
  See application file for complete search history.

(56) References Cited

U.S. PATENT DOCUMENTS

| | | | |
|---|---|---|---|
| 8,130,582 B2 * | 3/2012 | Shimano | G11C 15/046 365/210.1 |
| 9,235,414 B2 | 1/2016 | Gopal et al. | |
| 9,246,526 B2 | 1/2016 | Wang et al. | |
| 10,025,709 B2 | 7/2018 | Wang | |
| 10,242,728 B2 | 3/2019 | Li et al. | |
| 2005/0125477 A1 | 6/2005 | Genov et al. | |
| 2005/0285862 A1 * | 12/2005 | Noda | G11C 7/1006 345/530 |

(Continued)

FOREIGN PATENT DOCUMENTS

KR    1020180046345    5/2018

*Primary Examiner* — Mohammed A Bashar
(74) *Attorney, Agent, or Firm* — F. Chau & Associates, LLC

(57) ABSTRACT

Provided is a memory device that includes a memory bank including a plurality of memory cells arranged in a region where a plurality of word lines and a plurality of bit lines of the memory device intersect each other, a sense amplifier configured to amplify a signal transmitted through selected bit lines among the plurality of bit lines, and an arithmetic circuit configured to receive a first operand from the sense amplifier, receive a second operand from outside the memory device, and perform an arithmetic operation by using the first operand and the second operand, based on an internal arithmetic control signal generated in the memory device.

19 Claims, 16 Drawing Sheets

(56) References Cited

U.S. PATENT DOCUMENTS

| | | |
|---|---|---|
| 2013/0084077 A1 | 4/2013 | Kanada et al. |
| 2016/0379108 A1 | 12/2016 | Chung et al. |
| 2017/0337468 A1 | 11/2017 | Bruestle et al. |
| 2018/0121130 A1 | 5/2018 | Li et al. |
| 2018/0189635 A1 | 7/2018 | Olarig et al. |

* cited by examiner

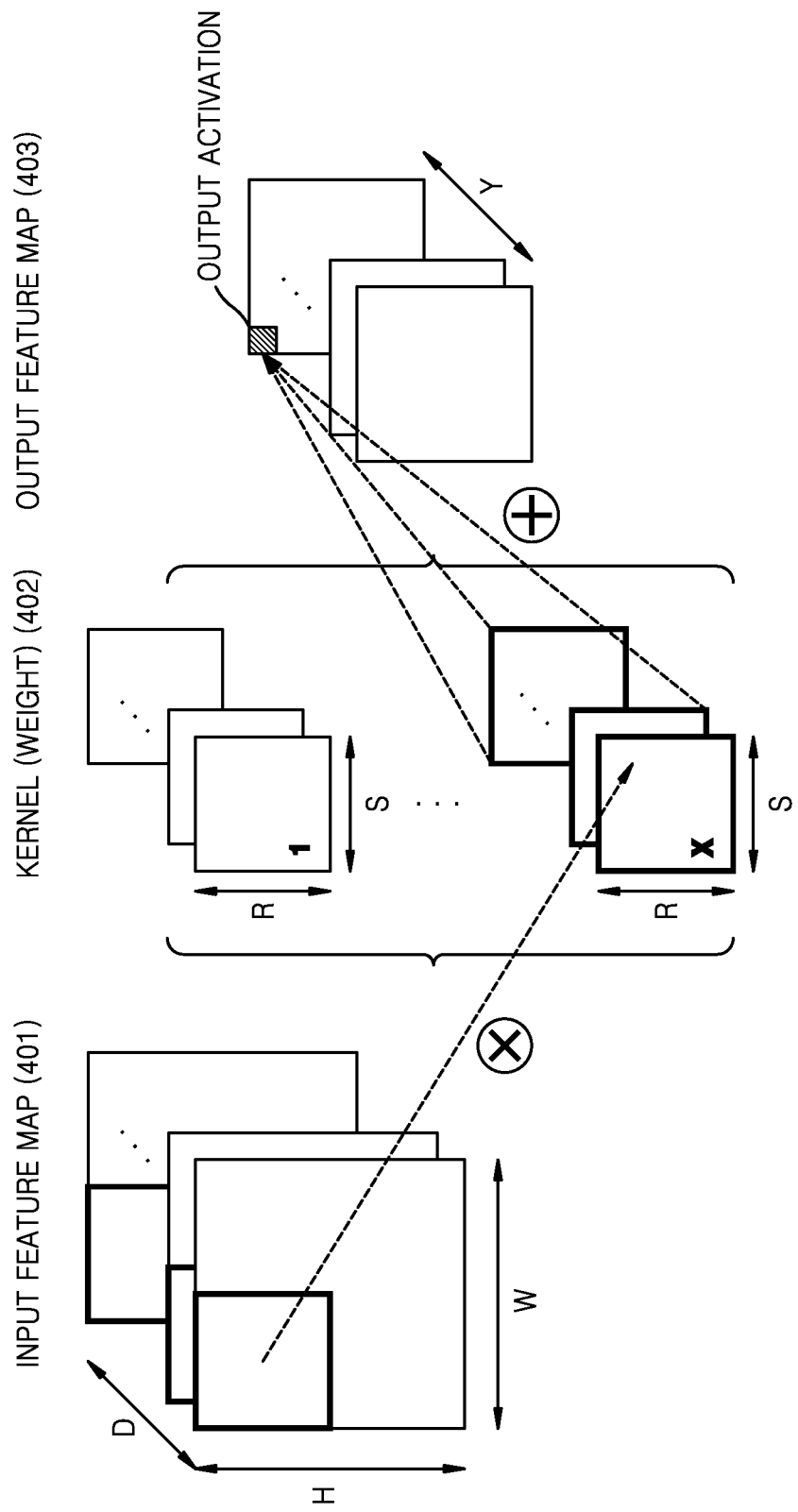

MEMORY DEVICE INCLUDING ARITHMETIC CIRCUIT AND NEURAL NETWORK SYSTEM INCLUDING THE SAME

CROSS-REFERENCE TO RELATED APPLICATION

This U.S. non-provisional patent application claims the benefit of and priority under 35 U.S.C. 119 to Korean Patent Application No. 10-2018-0141950, filed on Nov. 16, 2018, in the Korean Intellectual Property Office, the disclosure of which is incorporated by reference in its entirety herein.

BACKGROUND

1. Technical Field

The inventive concept relates to a memory device and a neural network system, and more particularly, to a memory device including an arithmetic circuit and a neural network system including the memory device.

2. Discussion of Related Art

Semiconductor memory devices may be classified into volatile memory devices that require power to maintain stored information and nonvolatile memory devices that maintain stored information even when a power supply thereto is interrupted. Volatile memory devices have high read/write speeds. On the other hand, nonvolatile memory devices have lower read/write speeds than volatile memory devices.

Neural networks refer to computational architectures that model biological brains. Recently, with the development of neural network technology, research has been actively conducted to analyze input data and extract valid information in various types of electronic systems by using neural network devices using one or more neural network models.

SUMMARY

At least one embodiment of the inventive concept provides a method and apparatus for reducing the time required for data transmission and increasing the power efficiency of a system in a memory device and a neural network system including the memory device.

According to an exemplary embodiment of the inventive concept, there is provided a memory device including: a memory bank including a plurality of memory cells arranged in a region where a plurality of word lines and a plurality of bit lines intersect each other; a sense amplifier configured to amplify a signal transmitted through selected bit lines among the plurality of bit lines; and an arithmetic circuit configured to receive a first operand from the sense amplifier, receive a second operand from outside the memory device, and perform an arithmetic operation by using the first operand and the second operand, based on an internal arithmetic control signal generated in the memory device.

According to an exemplary embodiment of the inventive concept, there is provided a memory device including: at least one memory bank including a plurality of memory cells; control logic configured to generate an internal arithmetic control signal including an internal read signal based on an arithmetic control signal received from a processor located outside the memory device; and an arithmetic circuit configured to perform all or some of a plurality of convolution operations of the processor on input feature data and kernel data, based on the internal arithmetic control signal provided by the control logic. At least one of the input feature data and the kernel data is input to the arithmetic circuit from the at least one memory bank through an electrical path including a sense amplifier, based on the internal read signal generated by the control logic.

According to an exemplary embodiment of the inventive concept, there is provided a neural network system for performing a neural network operation, the neural network system including: a neural network processor configured to generate an arithmetic control signal for controlling an arithmetic operation of a memory device; and a memory device configured to generate an internal arithmetic control signal including an internal read signal, based on the arithmetic control signal provided from the neural network processor, internally read at least one of input feature data and kernel data from a memory bank when the internal read signal is generated, generate calculated data by performing all or some of a plurality of convolution operations of the neural network processor by using the input feature data and the kernel data, and provide the calculated data to the neural network processor.

BRIEF DESCRIPTION OF THE DRAWINGS

Exemplary embodiments of the inventive concept will be more clearly understood from the following detailed description taken in conjunction with the accompanying drawings in which:

FIGS. 4A and 4B are diagrams illustrating a convolution operation of a neural network;

DETAILED DESCRIPTION OF THE EXEMPLARY EMBODIMENTS

Hereinafter, exemplary embodiments of the inventive concept will be described in detail with reference to the accompanying drawings.

Figure 1:
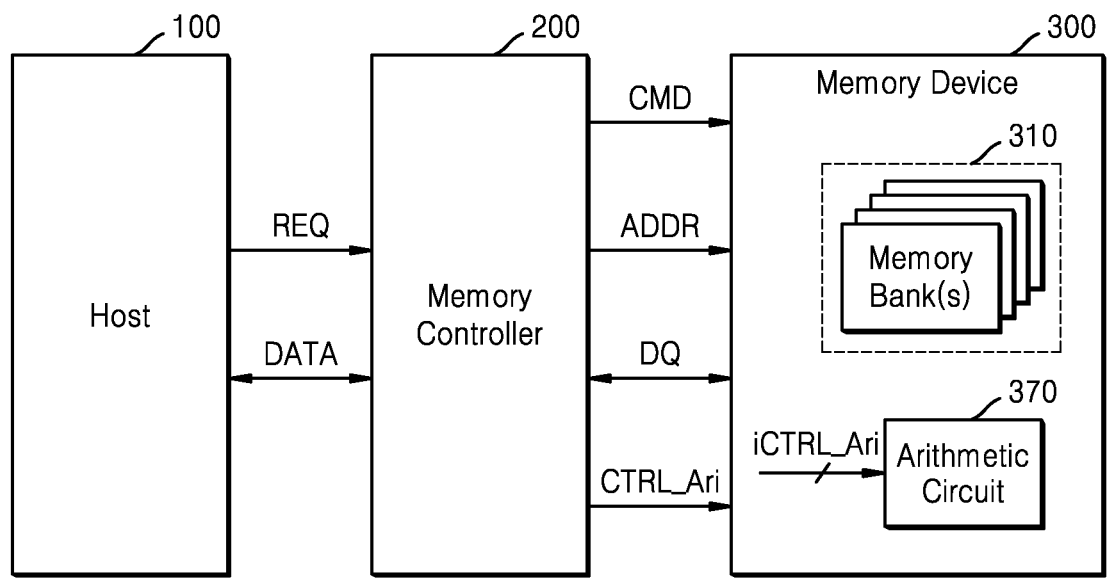
FIG. 1 illustrates a data processing system according to an exemplary embodiment of the inventive concept.

FIG. 1 illustrates a data processing system 10 according to an exemplary embodiment of the inventive concept. The data processing system 10 include a host 100 (e.g., a host device), a memory controller 200 (e.g., a control circuit), and a memory device 300. The data processing system 10 may be applied to various electronic devices requiring memories, such as servers, desktop computers, notebook computers, smart phones, tablet personal computers (PCs), printers, scanners, monitors, digital cameras, digital music players, digital media recorders, and portable game consoles, but is not limited thereto.

The host 100 may provide data DATA and a request REQ to the memory controller 200. For example, the host 100 may provide the memory controller 200 with a request REQ such as a read request or a write request for data DATA. In addition, the host 100 may provide commands, addresses, priority information, and the like to the memory controller 200, but is not limited thereto. The host 100 and the memory controller 200 may exchange data and signals with each other based on at least one of various interface protocols such as a universal serial bus (USB) protocol, a multimedia card (MMC) protocol, a serial-ATA protocol, a parallel-ATA protocol, a small computer small interface (SCSI) protocol, an enhanced small disk interface (ESDI) protocol, and an integrated drive electronics (IDE) protocol. The host 100 may be implemented as a system on chip (SoC) or an application processor including a central processing unit (CPU) and/or a graphic processing unit (GPU) together with the memory controller 200.

The memory controller 200 may control the memory device 300 in response to the request REQ of the host 100. For example, the memory controller 200 may control the memory device 300 such that the memory device 300 writes data DATA in response to a write request received from the host 100 or reads data DATA in response to a read request received from the host 100. For this purpose, the memory controller 200 may provide a command CMD and an address ADDR to the memory device 300, and data DQ to be written and read data DQ may be exchanged between the memory controller 200 and the memory devices 300. In an embodiment, the memory controller 200 provides an arithmetic control signal CTRL_Ari to the memory device 300 so that the memory device 300 performs an arithmetic operation. In an embodiment, the memory controller 200 provides a control signal for controlling a write operation and/or a read operation of the memory device 300, and the memory controller 200 provides the arithmetic control signal CTRL_Ari to the memory device 300 through a line (e.g., a conductive signal line) through which the control signal is transmitted.

The memory device 300 includes at least one memory bank 310 and an arithmetic circuit 370. The at least one memory bank 310 may include a memory cell array and may include a plurality of memory cells. For example, the at least one memory bank 310 may include a plurality of memory cells arranged in a region where a plurality of word lines and a plurality of bit lines intersect each other. The plurality of memory cells included in the memory bank 310 may be addressed by an address ADDR, and the address ADDR may include a plurality of bits for addressing the plurality of memory cells.

In an embodiment, the memory device 300 may be implemented as a volatile memory device. The volatile memory device may be implemented as a random access memory (RAM), a dynamic RAM (DRAM), or a static RAM (SRAM), but is not limited thereto. For example, the memory device 300 may correspond to a double data rate synchronous dynamic random access memory (DDR SDRAM), a low power double data rate (LPDDR) SDRAM, a graphics double data rate (GDDR) SDRAM, or a Rambus dynamic random access memory (RDRAM). Alternatively, the memory device 300 may be implemented as a high bandwidth memory (HBM). On the other hand, in an embodiment, the memory device 300 may be implemented as a nonvolatile memory device. As an example, the memory device 300 may be implemented as a resistive memory such as a phase change RAM (PRAM), a magnetic RAM (MRAM), or a resistive RAM (RRAM).

According to an exemplary embodiment of the inventive concept, the memory device 300 includes an arithmetic circuit 370. The arithmetic circuit 370 may perform an arithmetic operation by using a plurality of operands. In an embodiment, the arithmetic circuit 370 performs an arithmetic operation based on an internal arithmetic control signal iCTRL_Ari generated in the memory device 300. In an embodiment, at least some of the plurality of operands are data stored in the at least one memory bank 310. For example, the arithmetic circuit 370 may perform an arithmetic operation by using a first operand and a second operand, and at least one of the first operand and the second operand may be data stored in the memory bank 310. The arithmetic circuit 370 may generate calculated data by performing an arithmetic operation by using a plurality of operands. The calculated data generated by the arithmetic circuit 370 may be provided to the memory controller 200 through a path including a data input/output buffer.

In an embodiment, the internal arithmetic control signal iCTRL_Ari includes an internal read signal and an internal write signal. In an exemplary embodiment when the internal read signal is generated, the memory device 300 transmits an operand from the memory bank 310 to the arithmetic circuit 370 through a path including a sense amplifier. Thus, a series of processes for transmitting the operand from the memory bank 310 to the arithmetic circuit 370 may be referred to as an internal read operation. In an exemplary embodiment, when the internal write signal is generated, the memory device 300 transmits an operand provided from outside the memory device 300 (e.g., from the memory controller 200) to the arithmetic circuit 370 through a path including a data input/output buffer. Thus, a series of processes for transmitting the operand from outside the memory device 300 to the arithmetic circuit 370 may be referred to as an internal write operation. Also, in an embodiment, the internal arithmetic control signal iCTRL_Ari further includes at least one of an arithmetic operation start signal for starting an arithmetic operation of the arithmetic circuit 370, an arithmetic initialization signal for initializing the arithmetic circuit 370, and an output signal for controlling the arithmetic circuit 370 to output calculated data. The internal arithmetic control signal iCTRL_Ari will be described in more detail with reference to FIG. 11.

In an embodiment, the arithmetic circuit 370 performs all or some convolution operations. For example, the memory controller 200 may be configured to perform convolution operations, but also to offload some or all of these convolution operations to the arithmetic circuit 370. As described with reference to FIGS. 2 to 4B, a neural network system may perform a convolution operation, and the arithmetic circuit 370 included in the memory device 300 may perform all or some of the convolution operations. For this purpose, the arithmetic circuit 370 may include a multiplication and accumulation circuit for performing a multiplication operation and an addition operation, which will be described in more detail with reference to FIGS. 7 and 8. Also, in an embodiment, the arithmetic circuit 370 includes multiplication and accumulation circuits connected in a ring form, which will be described in more detail with reference to FIG. 9. Also, in an exemplary embodiment of the inventive concept, the arithmetic circuit 370 further includes a non-linear function processor and a quantizer, which will be described in more detail with reference to FIG. 10.

In an embodiment, the arithmetic circuit 370 is arranged in a region where an input/output sense amplifier is arranged. In other words, the arithmetic circuit 370 may receive a signal amplified by the input/output sense amplifier as an operand from the input/output sense amplifier. An embodiment in which the arithmetic circuit 370 is arranged in a region where the input/output sense amplifier is arranged will be described in more detail with reference to FIG. 6. However, the inventive concept is not limited thereto, and the arithmetic circuit 370 may be arranged in a region where a bit line sense amplifier is arranged. In other words, the arithmetic circuit 370 may receive a signal amplified by the bit line sense amplifier as an operand from the bit line sense amplifier. An embodiment in which the arithmetic circuit 370 is arranged in a region where the bit line sense amplifier is located will be described in more detail with reference to FIG. 16.

In the data processing system 10 according to an exemplary embodiment of the inventive concept, since the arithmetic circuit 370 of the memory device 300 performs an arithmetic operation on the operands based on the internal arithmetic control signal iCTRL_Ari generated in the memory device 300 and transmits the calculated data to the memory controller 200, the amount of data exchanged between the memory controller 200 and the memory device 300 may be reduced. Accordingly, the time during which data is transmitted from the memory device 300 to the memory controller 200 may also be reduced and thus the data transmission overhead of the data processing system 10 may be reduced. Also, since the amount of data exchanged between the memory controller 200 and the memory device 300 is reduced, the power efficiency of the data processing system 10 may be improved.

Figure 2:
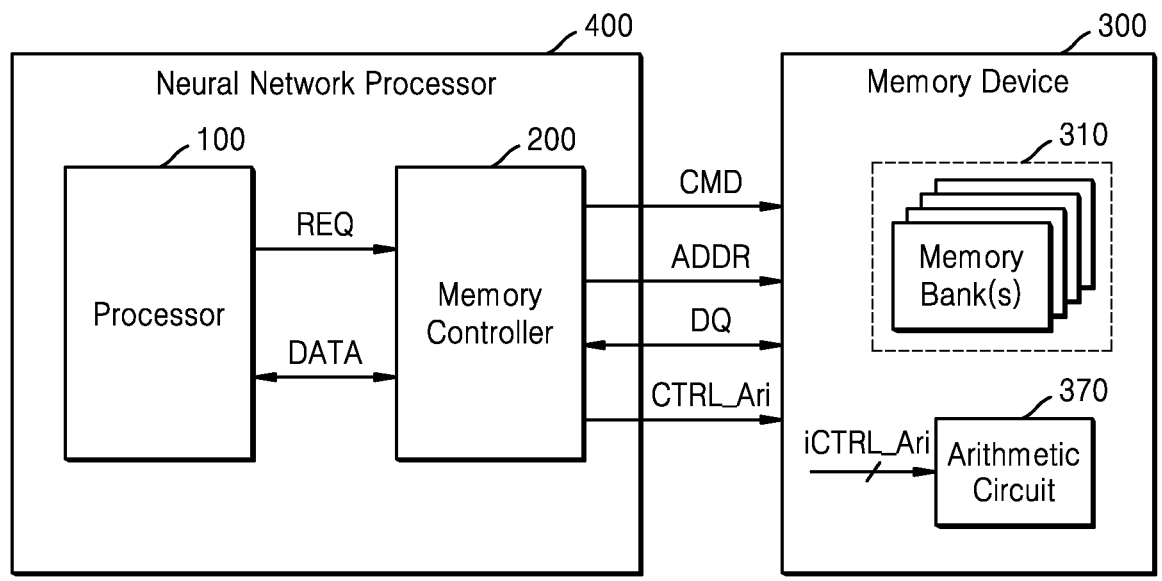
FIG. 2 illustrates a neural network system according to an example embodiment of the inventive concept.

FIG. 2 illustrates a neural network system 20 according to an exemplary embodiment of the inventive concept. The neural network system 20 includes a neural network processor 400 and a memory device 300, and the neural network processor 400 includes a processor 100 and a memory controller 200. In an embodiment, the neural network processor 400 or the processor 100 is a microprocessor that specializes in the acceleration of machine learning algorithms such as artificial neural networks. Referring to FIG. 2 in comparison with FIG. 1, the processor 100 of FIG. 2 may correspond to the host 100 of FIG. 1, and the memory controller 200 and memory device 300 of FIG. 2 may correspond to the memory controller 200 and memory device 300 of FIG. 1. Redundant descriptions about FIG. 2 with respect to FIG. 1 will be omitted for conciseness.

The neural network processor 400 may generate a neural network, train or learn a neural network, or perform an arithmetic operation based on the received input data and may generate an information signal or retrain the neural network based on a result of performing the arithmetic operation. Models of the neural network may include various types of models such as Convolution Neural Network (CNN), Region with Convolution Neural Network (RNN), Region Proposal Network (RPN), Recurrent Neural Network (RNN), Stacking-based Deep Neural Network (S-DNN), State-Space Dynamic Neural Network (S-SDNN), Deconvolution Network, Deep Belief Network (DBN), Restricted Boltzmann Machine (RBM), Fully Convolutional Network, Long Short-Term Memory (LSTM) Network, and Classification Network, such as GoogleNet, AlexNet, and VGG Network, but are not limited thereto. The processor 100 may perform operations according to the models of the neural network. Also, the neural network processor 400 may include a separate memory for storing programs corresponding to the models of the neural network. The neural network processor 400 may be otherwise referred to as a neural network processing device or a neural network processing unit (NPU).

The neural network processor 400 may perform a convolution operation by using an input feature map and a kernel as described with reference to FIGS. 3 to 4B. Data included in the input feature map will be referred to as input feature data, and data included in the kernel will be referred to as kernel data.

A general neural network system receives both input feature data and kernel data from a memory device when performing a convolution operation. Thus, in the general neural network system, as the number of convolution operations and/or the amount of data increases, the amount of data exchanged between a neural network processor and a memory device may also increase. Accordingly, the general neural network system has a limitation in that data transmission overhead increases and power consumption increases.

In the neural network system 20 according to an exemplary embodiment of the inventive concept, since the arithmetic circuit 370 of the memory device 300 performs all or some of the convolution operations by using the input feature data and the kernel data based on the internal arithmetic control signal iCTRL_Ari generated in the memory device 300 and transmits the calculated data to the memory controller 200, the amount of data exchanged between the memory controller 200 and the memory device 300 may be reduced. For example, instead of transmitting the input feature data and/or the kernel data from the memory device 300 to the neural network processor 400 for processing by the neural network processor 400, some or all of the convolution operations that would otherwise be performed by the neural network processor 400 can be offloaded to the arithmetic circuit 370 of the memory device 300. Accordingly, the time during which data is transmitted from the memory device 300 to the memory controller 200 may also be reduced and thus the data transmission overhead of the neural network system 20 may be reduced. Also, since the amount of data exchanged between the neural network processor 400 and the memory device 300 is reduced, the power efficiency of the neural network system 20 may be improved.

Figure 3:
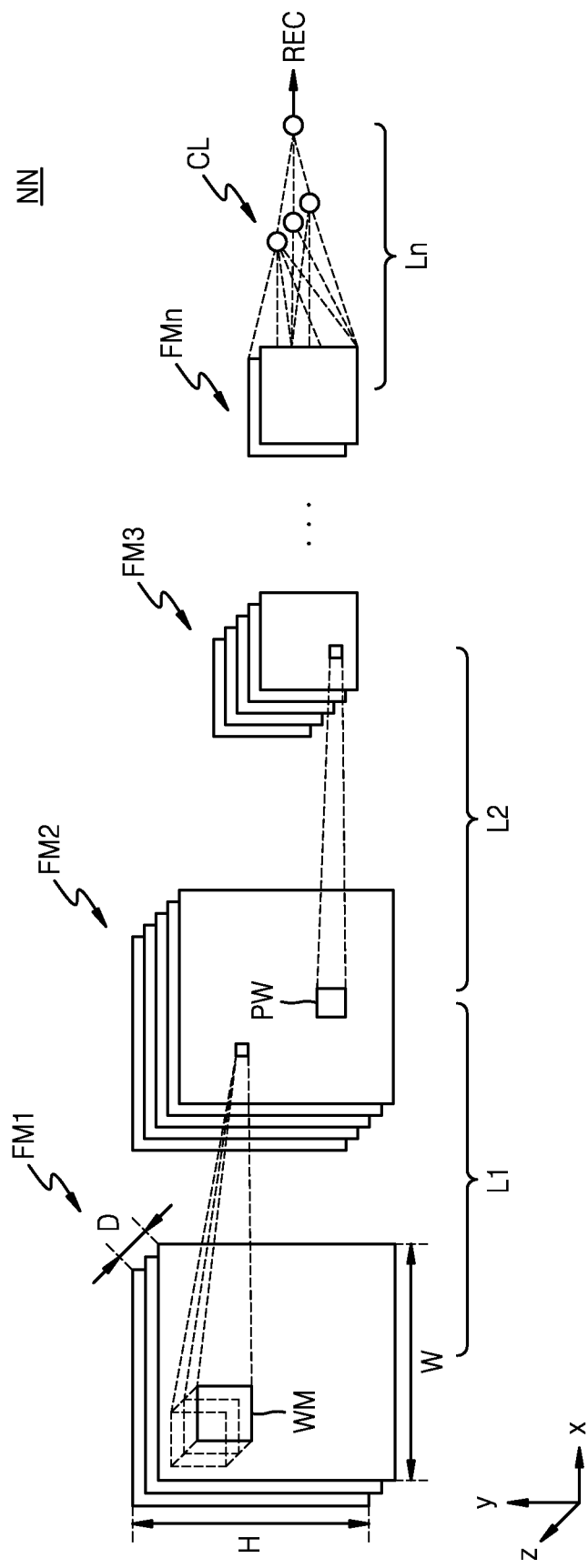
FIG. 3 illustrates a structure of a convolution neural network as an example of a neural network structure.

FIG. 3 illustrates a structure of a convolution neural network as an example of a neural network structure. A neural network NN may include a plurality of layers L1 to Ln. Each of the plurality of layers L1 to Ln may be a linear layer or a nonlinear layer. In an embodiment, at least one linear layer and at least one nonlinear layer are combined and referred to as one layer. For example, the linear layer may include a convolution layer and a fully-connected layer, and the nonlinear layer may include a pooling layer and an activation layer.

For example, a first layer L1 may be a convolution layer, a second layer L2 may be a pooling layer, and an nth layer Ln may be a fully-connected layer as an output layer. The neural network NN may further include an activation layer and may further include a layer for performing other types of operations.

Each of the plurality of layers L1 to Ln may receive input data (e.g., an image frame or image data for a frame of a display panel) or a feature map generated in a previous layer as an input feature map and generate an output feature map or a recognition signal REC by operating on the input feature map. In this case, the feature map may mean data in which various features of input data are represented. Feature maps FM1, FM2, and FMn may have, for example, the form of a two-dimensional (2D) matrix or a three-dimensional (3D) matrix (or tensor). The feature maps FM1, FM2, and FMn may have a width W (or column), a height H (or row), and a depth D, which may correspond respectively to an x axis, a y axis, and a z axis on coordinates. In this case, the depth D may be referred to as the number of channels.

The first layer L1 may generate the second feature map FM2 by convoluting (convolving) the first feature map FM1 with a weight map WM. The weight map WM may filter the first feature map FM1 and may also be referred to as a filter or kernel. In an embodiment, the depth of the weight map WM, that is, the number of channels, is equal to the depth of the first feature map FM1, that is, the number of channels, and the same channels of the weight map WM and the first feature map FM1 are convoluted (convolved) with each other. The weight map WM may be shifted in such a manner that the first feature map FM1 is traversed as a sliding window. The amount of shifting may be referred to as "stride length" or "stride". In an exemplary embodiment, during each shift, each of the weight values included in the weight map WM is multiplied and added with all feature data in an overlapping region with the first feature map FM1. The data of the first feature map FM1 in a region where each of the weight values included in the weight map WM overlaps with the first feature map FM1 may be referred to as extraction data. As the first feature map FM1 and the weight map WM are convoluted together, one channel of the second feature map FM2 is generated. Although one weight map WM is illustrated in FIG. 3, a plurality of weight maps may be convoluted with the first feature map FM1 to generate a plurality of channels of the second feature map FM2. In other words, the number of channels of the second feature map FM2 may correspond to the number of weight maps.

In an exemplary embodiment, the second layer L2 generates a third feature map FM3 by changing the spatial size of the second feature map FM2 through pooling. Pooling may be referred to as sampling or down-sampling. A 2D pooling window PW may be shifted on the second feature map FM2 in units of the size of the pooling window PW, and the maximum value of the feature data in a region overlapping with the pooling window PW (or the average value of the feature data) may be selected. Accordingly, the third feature map FM3 with a changed spatial size may be generated from the second feature map FM2. In an exemplary embodiment, the number of channels of the third feature map FM3 and the number of channels of the second feature map FM2 are equal to each other.

The nth layer Ln may classify a class CL of input data by combining the features of an nth feature map FMn. Also, the nth layer Ln may generate a recognition signal REC corresponding to the class CL. In an embodiment, the input data corresponds to frame data included in a video stream, and by extracting a class CL corresponding to an object included in an image represented by the frame data based on the nth feature map FMn provided from the previous layer, the nth layer Ln may recognize the object and generate a recognition signal REC corresponding to the recognized object.

Figure 4B:
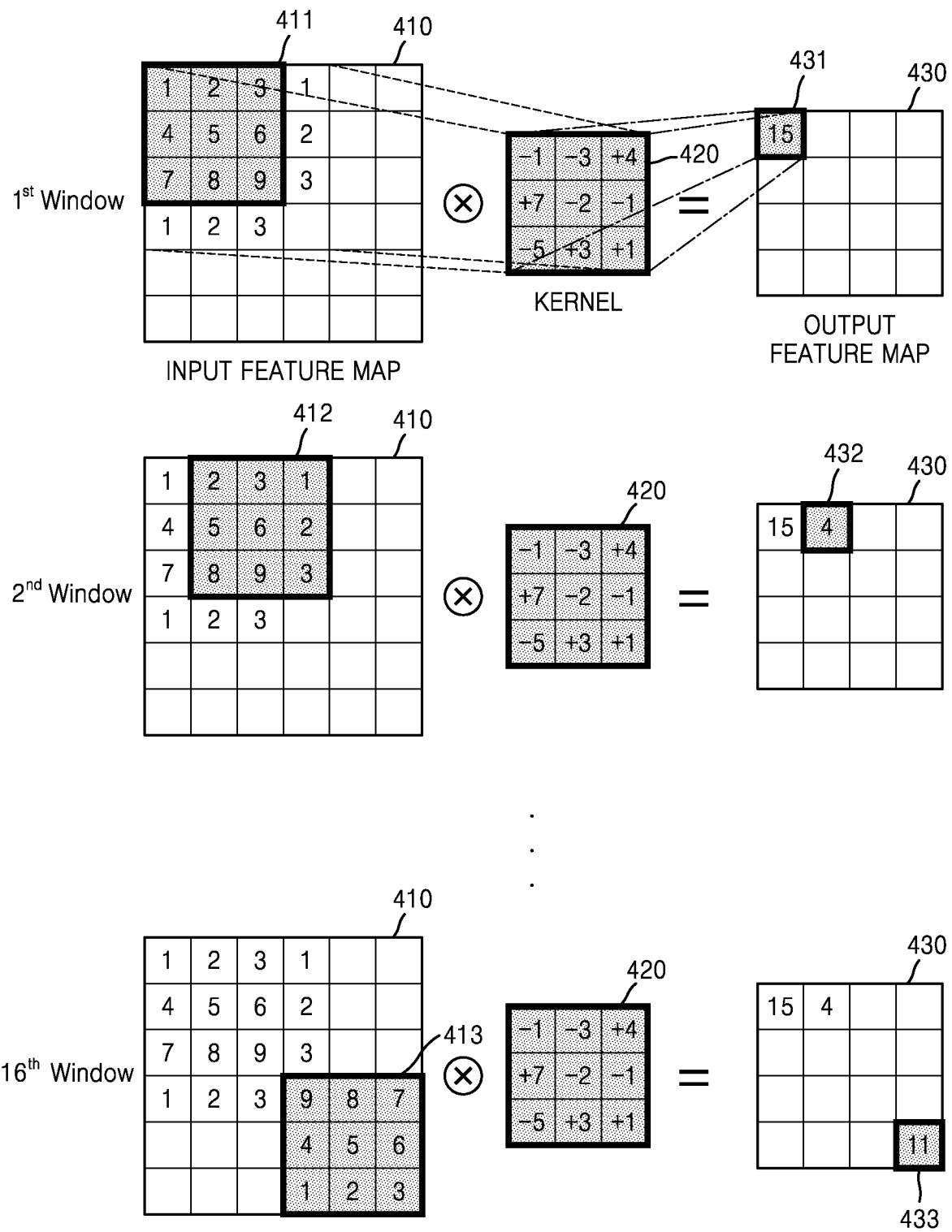

FIGS. 4A and 4B are diagrams illustrating a convolution operation of a neural network.

Referring to FIG. 4A, input feature maps 401 may include D channels, and the input feature map of each channel may have a size of H rows and W columns (D, H, and W are natural numbers). Each of kernels 402 may have a size of R rows and S columns, and the kernels 402 may include a number of channels corresponding to a channel number (or depth) D of the input feature maps 401 (R and S are natural numbers). Output feature maps 403 may be generated through a 3D convolution operation between the input feature maps 401 and the kernels 402 and may include Y channels according to the convolution operation.

A process of generating an output feature map through a convolution operation between one input feature map and one kernel may be described with reference to FIG. 4B, and the output feature maps 403 of all channels may be generated by performing a 2D convolution operation illustrated in FIG. 4B, between the input feature maps 401 of all channels and the kernels 402 of all channels.

Referring to FIG. 4B, for convenience of description, it is assumed that an input feature map 410 has a size of 6×6, an original kernel 420 has a size of 3×3, and an output feature map 430 has a size of 4×4; however, the inventive concept is not limited thereto and the neural network may be implemented by feature maps and kernels of various sizes. Also, the values defined in the input feature map 410, the original kernel 420, and the output feature map 430 are merely example values, and embodiments according to the inventive concept are not limited thereto.

The original kernel 420 may perform a convolution operation while sliding in the input feature map 410 in units of in a 3×3 window. The convolution operation may represent an operation for obtaining each feature data of the output feature map 430 by summing all of the values obtained by multiplication between each feature data of a window of the input feature map 410 and each of the weight values of the corresponding positions in the original kernel 420. The data included in the window of the input feature map 410 multiplied by the weight values may be referred to as extraction data extracted from the input feature map 410. Particularly, the original kernel 420 may first perform a convolution operation with first extraction data 411 of the input feature map 410. That is, the respective feature data 1, 2, 3, 4, 5, 6, 7, 8, and 9 of the first extraction data 411 may be multiplied respectively by the corresponding weight values −1, −3, 4, 7, −2, −1, −5, 3, and 1 of the original kernel 420, and −1, −6, 12, 28, −10, −6, −35, 24, and 9 may be obtained as a result thereof. Next, "15" may be obtained as a result of adding all of the obtained values −1, −6, 12, 28, −10, −6, −35, 24, and 9, and feature data 431 of the first row and first column of the output feature map 430 may be determined as "15". Here, the feature data 431 in the first row and first column of the output feature map 430 may correspond to the first extraction data 411. Likewise, by performing a convolution operation between the original kernel 420 and second extraction data 412 of the input feature map 410, feature data 432 of the first row and second column of the output feature map 430 may be determined as "4". Finally, by performing a convolution operation between the original kernel 420 and 16th extraction data 413 (i.e., the last extraction data) of the input feature map 410, feature data 433 of the fourth row and fourth column of the output feature map 430 may be determined as "11".

In other words, a convolution operation between one input feature map 410 and one original kernel 420 may be processed by repeatedly performing multiplication of the extraction data of the input feature map 410 and the corresponding weight values of the original kernel 420 and summation of the multiplication results, and an output feature map 430 may be generated as a result of the convolution operation.

Figure 5:
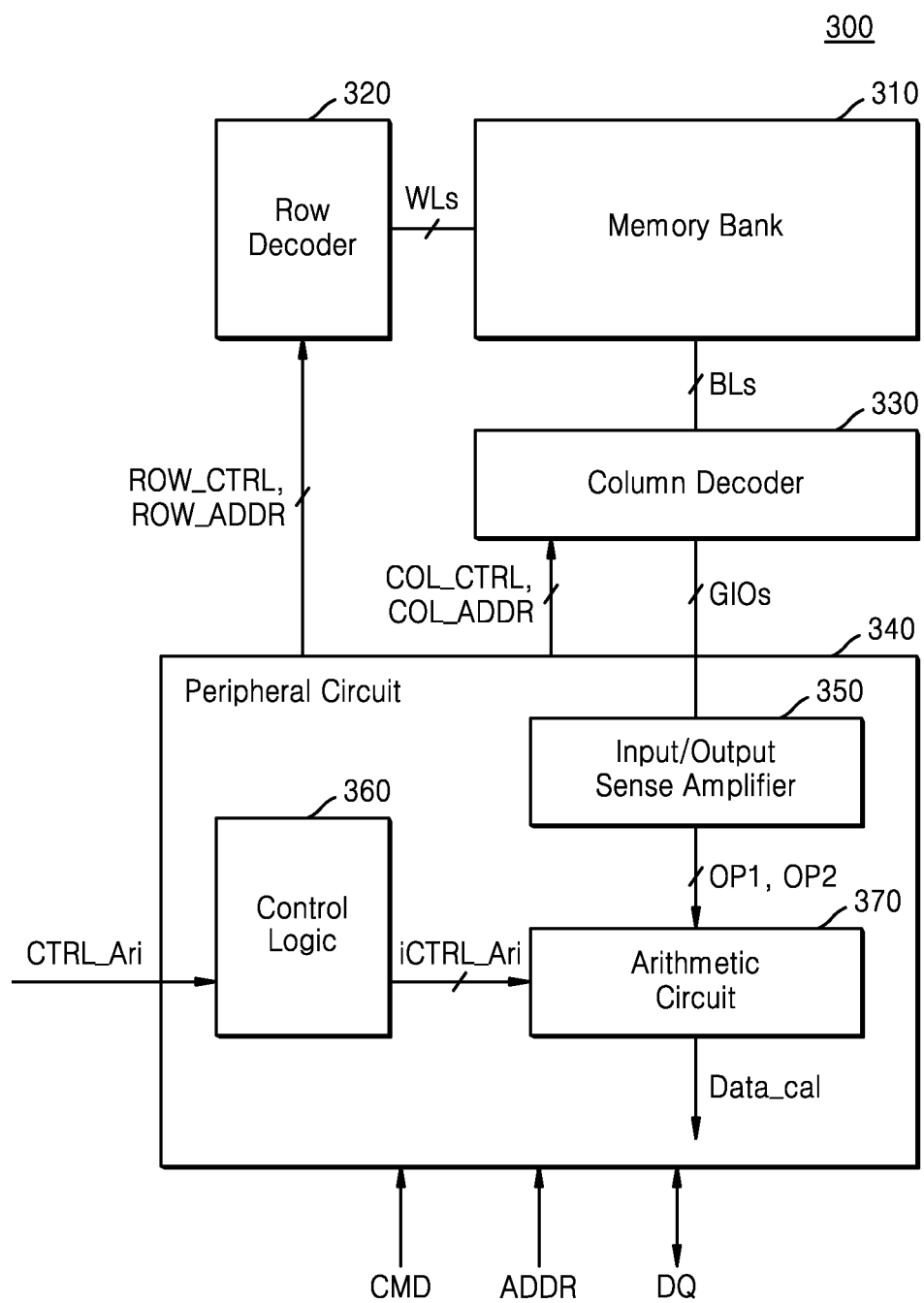
FIG. 5 illustrates a memory device according to an exemplary embodiment of the inventive concept.

FIG. 5 illustrates a memory device 300 according to an exemplary embodiment of the inventive concept. The memory device 300 includes a memory bank 310, a row decoder 320 (e.g., a decoder circuit), a column decoder 330 (e.g., a decoder circuit), and a peripheral circuit 340. The peripheral circuit 340 includes an input/output sense amplifier 350, control logic 360 (e.g., logic circuit), and an arithmetic circuit 370. For convenience of description, FIG. 5 illustrates a case where the memory device 300 includes one memory bank 310; however, the number of memory banks is not limited thereto. For example, the memory device 300 may include a plurality of memory banks. Redundant descriptions about FIG. 5 with respect to the memory device 300 of FIG. 1 will be omitted for conciseness.

The memory bank 310 may include a plurality of memory cells arranged in a region where a plurality of word lines WLs and a plurality of bit lines BLs intersect each other. In an embodiment, each of the plurality of memory cells is a DRAM cell including one transistor and one capacitor. The memory bank 310 may be driven by the row decoder 320 and the column decoder 330.

The row decoder 320 may select at least one word line among the word lines WLs under the control of the peripheral circuit 340. The row decoder 320 may receive an input of a row decoder control signal ROW_CTRL and a row address ROW_ADDR from the peripheral circuit 340. The row decoder control signal ROW_CTRL and the row address ROW_ADDR may be generated by the peripheral circuit 340 based on the command CMD and the address ADDR provided by the memory controller 200 of FIG. 1 located outside the memory device 300. For example, when an active command and word line addresses to be activated are input to the memory device 300, the peripheral circuit 340 may activate the row decoder control signal ROW_CTRL and generate the row address ROW_ADDR. The row decoder 320 may select at least one word line based on the row decoder control signal ROW_CTRL and the row address ROW_ADDR. A set of memory cells connected to the selected word line may be considered as a selected page.

The column decoder 330 may select at least one bit line among the bit lines BLs under the control of the peripheral circuit 340. The bit lines selected by the column decoder 330 may be connected to global input/output lines GIOs. The column decoder 330 may receive an input of a column decoder control signal COL_CTRL and a column address COL_ADDR from the peripheral circuit 340. For example, after the active command, a write command or a read command may be input to the memory device 300 to store data in the selected page or read data from the selected page.

The peripheral circuit 340 may activate the column decoder control signal COL_CTRL and generate the column address COL_ADDR.

The peripheral circuit 340 may receive an input of a command CMD and an address ADDR from the memory controller 200 located outside the memory device 300. The peripheral circuit 340 may generate the row decoder control signal ROW_CTRL, the row address ROW_ADDR, the column decoder control signal COL_CTRL, and the column address COL_ADDR based on the command CMD and the address ADDR. The peripheral circuit 340 may provide the row decoder control signal ROW_CTRL and the row address ROW_ADDR to the row decoder 320 and provide the column decoder control signal COL_CTRL and the column address COL_ADDR to the column decoder 330. The peripheral circuit 340 may exchange data DQ with the outside of the memory device 300. For example, the peripheral circuit 340 may exchange the data DQ with the outside through a data input/output pad of the memory device 300.

The peripheral circuit 340 may include the input/output sense amplifier 350, the control logic 360, and the arithmetic circuit 370.

The input/output sense amplifier 350 may be connected to the global input/output lines GIOs connected to the bit lines BLs selected by the column decoder 330. The input/output sense amplifier 350 may amplify a signal transmitted from the memory bank 310 through the global input/output lines GIOs.

The control logic 360 may control an overall operation of the memory device 300. In an embodiment, the control logic 360 includes a command decoder (e.g., a decoder circuit) and may internally generate a decoded command signal by decoding command (CMD)-related signals such as a chip select signal /CS, a row address strobe signal /RAS, a column address strobe signal /CAS, a write enable signal /WE, and a clock enable signal CKE. In an embodiment, the control logic 360 generates an internal arithmetic control signal iCTRL_Ari based on the arithmetic control signal CTRL_Ari provided by the memory controller 200 located outside the memory device 300. The control logic 360 may provide the internal arithmetic control signal iCTRL_Ari to the arithmetic circuit 370.

In an embodiment, the control logic 360 controls the memory device 300 in an operation where a first operand OP1 and/or a second operand OP2 are stored in the memory bank 310. For example, it is assumed that the first operand OP1 is stored in the memory bank 310. The control logic 360 may control the first operand OP1 to be stored in the memory bank 310 by configuring the address of the memory bank 310 to store the first operand OP1 such that the first operand OP1 may be sequentially input to the arithmetic circuit 370.

The arithmetic circuit 370 may perform an arithmetic operation by using the first operand OP1 and the second operand OP2 based on the internal arithmetic control signal iCTRL_Ari provided by the control logic 360. At least one of the first operand OP1 and the second operand OP2 may be obtained from the memory bank 310 through a path including the input/output sense amplifier 350. For example, the arithmetic circuit 370 may obtain both the first operand OP1 and the second operand OP2 from the memory bank 310. Also, for example, the arithmetic circuit 370 may obtain any one of the first operand OP1 and the second operand OP2 from the memory bank 310 and obtain the other one of the first operand OP1 and the second operand OP2 from outside the memory device 300. The arithmetic circuit 370 may generate calculated data Data_cal by performing an arithmetic operation by using the first operand OP1 and the second operand OP2 and output the calculated data Data_cal to the outside of the memory device 300. For example, the arithmetic circuit 370 could multiply the first operand OP1 by the second operand OP2 to generate first multiplication data, add the first multiplication to second multiplication data, etc. In an embodiment, the arithmetic operation may include all or some of the convolution operations, where the first operand OP1 is the input feature data included in the input feature map, and the second operand OP2 is the kernel data included in the kernel.

The arithmetic circuit 370 may be implemented in various forms in the memory device 300, and the arithmetic circuit 370 may be implemented in a hardware form or a software form according to embodiments. For example, when the arithmetic circuit 370 is implemented in a hardware form, the arithmetic circuit 370 may include circuits for performing an arithmetic operation. Also, for example, when the arithmetic circuit 370 is implemented in a software form, an arithmetic operation may be performed by executing the random input/output code and/or the program (or instructions) stored in the memory device 300, by the control logic 360 or at least one processor in the memory device 300. However, the inventive concept is not limited to the above embodiments, and the arithmetic circuit 370 may be implemented as a combination of software and hardware, such as firmware.

Figure 6:
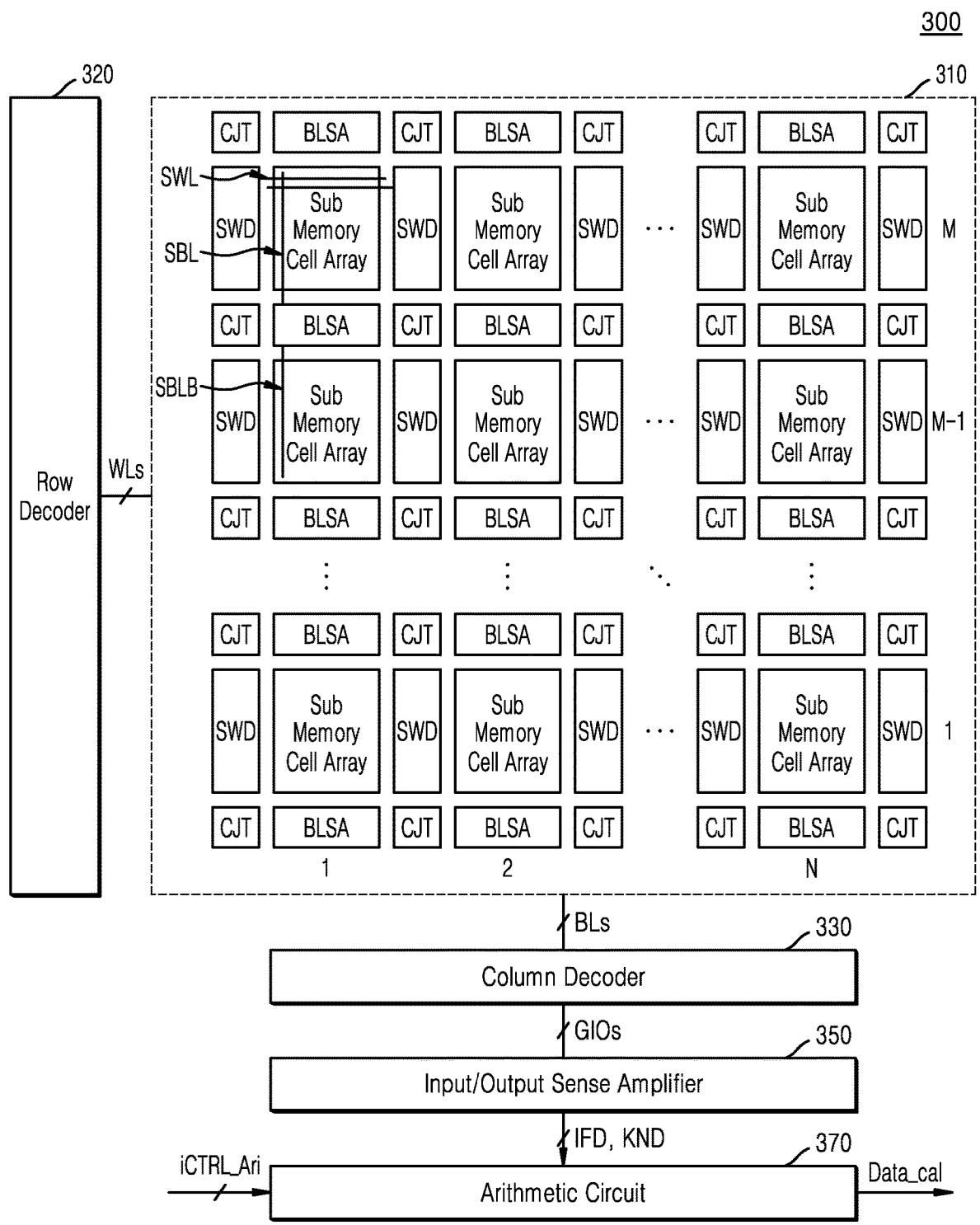
FIG. 6 illustrates a memory device according to an exemplary embodiment of the inventive concept.

FIG. 6 illustrates a memory device 300 according to an exemplary embodiment of the inventive concept. Redundant descriptions about the memory device 300 of FIG. 6 with respect to FIG. 5 will be omitted for conciseness.

The memory device 300 includes a memory bank 310, a row decoder 320, a column decoder 330, an input/output sense amplifier 350, and an arithmetic circuit 370.

The memory bank 310 may include a plurality of sub memory cell arrays arranged in a matrix form along the direction of a plurality of word lines WLs and a plurality of bit lines BLs. Each of the sub memory cell arrays may include a plurality of memory cells. Among the plurality of word lines WLs, a word line connected to a sub memory cell array will be referred to as a sub word line SWL, and among the plurality of bit lines BLs, a bit line connected to a sub memory cell array will be referred to as a sub bit line SBL. The memory bank 310 may include N (N is a natural number) sub memory cell arrays in the word line direction and may include M (M is a natural number) sub memory cell arrays in the bit line direction.

The memory bank 310 may include a plurality of bit line sense amplifiers (BLSA), a plurality of sub word line drivers (SWD), and a plurality of junctions (CJT). In an embodiment, each junction includes a power driver for driving one of the bit line sense amplifiers with a non-ground voltage and/or a ground driving for driving the one bit line sense amplifier with a ground voltage. Each of the plurality of sub word line drivers may drive the sub word lines connected to the sub word line driver. Each of the plurality of bit line sense amplifiers may amplify a voltage difference between the sub bit line SBL and a complementary sub bit line SBLB. In other words, the bit line sense amplifier may amplify the signal transmitted through the sub bit line SBL. The plurality of sub word line drivers and the plurality of bit line sense amplifiers may be repeatedly arranged between the plurality of sub memory cell arrays.

The data stored in the memory cell of the memory bank 310 may be transmitted to the input/output sense amplifier 350 through the bit lines BLs and the global input/output lines GIOs.

In an embodiment, the arithmetic circuit 370 is arranged in a region where the input/output sense amplifier 350 is arranged. Also, the arithmetic circuit 370 may obtain at least one of a first operand and a second operand from the memory bank 310 through a path including the input/output sense amplifier 350. For convenience of description, FIG. 6 illustrates an embodiment in which an arithmetic operation of the arithmetic circuit 370 is all or some of the convolution operations, the first operand is input feature data IFD, and the second operand is kernel data KND. In other words, based on the internal read signal included in the internal arithmetic control signal iCTRL_Ari generated in the memory device 300, the arithmetic circuit 370 obtains at least one of the input feature data IFD and the kernel data KND from the memory bank 310 through a path including the input/output sense amplifier 350. The arithmetic circuit 370 may generate calculated data Data_cal by performing all or some of the convolution operations by using the input feature data IFD and the kernel data KND. The arithmetic circuit 370 may output the calculated data Data_cal.

Figure 7:
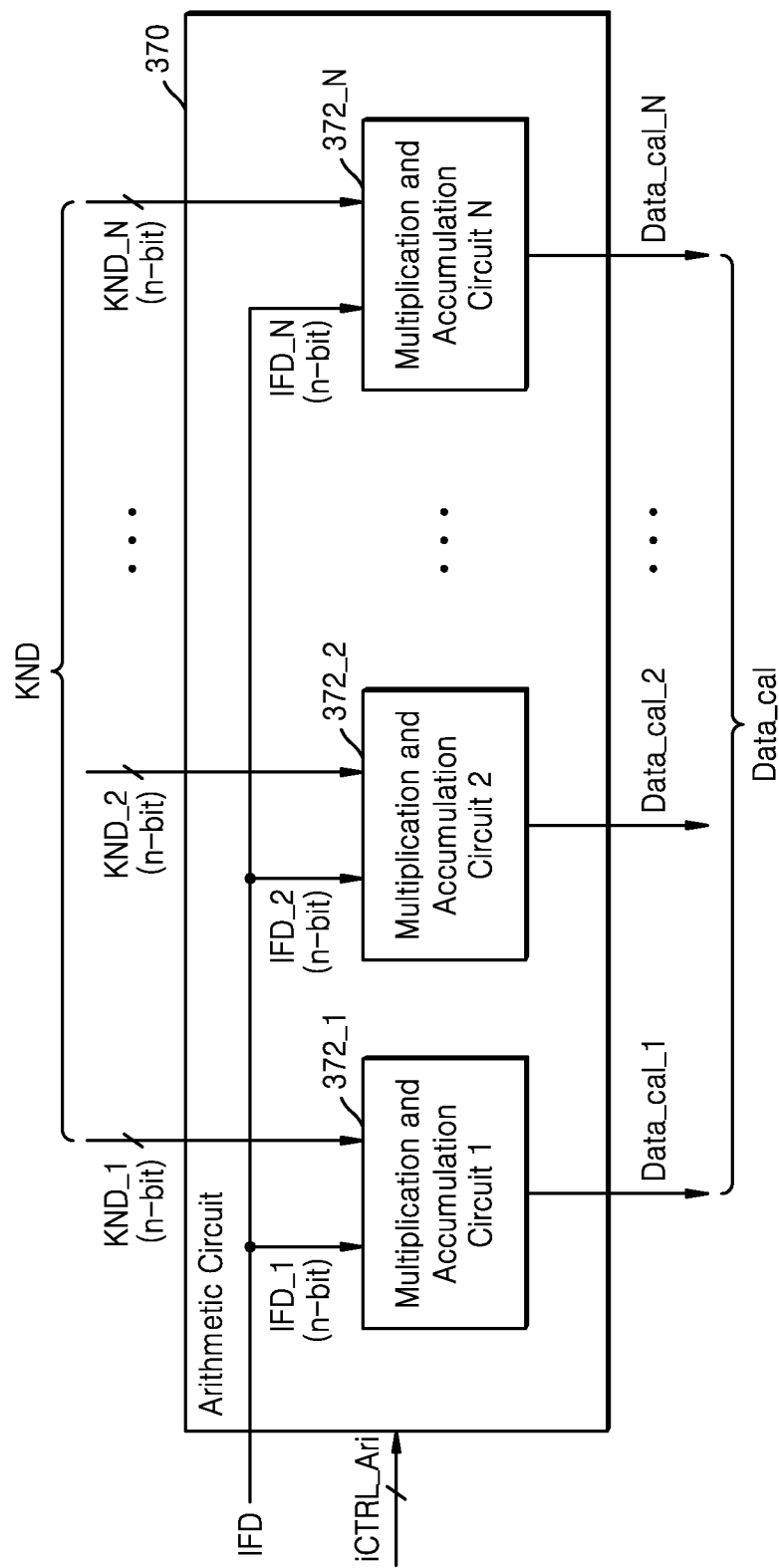
FIG. 7 illustrates an arithmetic circuit according to an exemplary embodiment of the inventive concept.

FIG. 7 illustrates an arithmetic circuit 370 according to an exemplary embodiment of the inventive concept. Redundant descriptions about the arithmetic circuit 370 of FIG. 7 with respect to FIGS. 1, 2, 5, and 6 will be omitted for conciseness. FIG. 7 will be described with reference to FIG. 6.

FIG. 7 illustrates a case where the input feature data IFD is input from outside the memory device 300 and the kernel data KND is obtained from the memory bank 310. However, this is merely for convenience of description, and the input feature data IFD may also be obtained from the memory bank 310.

The arithmetic circuit 370 includes a plurality of multiplication and accumulation circuits. For example, the arithmetic circuit 370 may include a first multiplication and accumulation circuit 372_1 to an Nth multiplication and accumulation circuit 372_N. Here, N may be equal to the number of sub memory cell arrays in the word line direction in the memory bank 310 of FIG. 6. The input feature data IFD may include first input feature data IFD_1 to Nth input feature data IFD_N, and the kernel data KND may include first kernel data KND_1 to Nth kernel data KND_N. Each of the first input feature data IFD_1 to the Nth input feature data IFD_N may be n-bit data (n is a natural number) data, and the first kernel data KND_1 to the Nth kernel data KND_N may be n-bit data. As a non-limiting example, the first input feature data IFD_1 to the Nth input feature data IFD_N and the first kernel data KND_1 to the Nth kernel data KND_N may be 8-bit data.

The first multiplication and accumulation circuit 372_1 may generate first calculated data Data_cal_1 by performing a multiplication operation and an addition operation by using the first input feature data IFD_1 and the first kernel data KND_1 and output the first calculated data Data_cal_1. For example, the first multiplication and accumulation circuit 372_1 may output the first calculated data Data_cal_1 in response to an output signal included in the internal arithmetic control signal iCTRL_Ari. As a non-limiting example, the first calculated data Data_cal_1 may be 2n-bit data or (2n+1)-bit data. As described with reference to FIGS. 4A and 4B, in the case of a convolution operation, it may include, a plurality of times, a process of multiplying and then summing the input feature data and the kernel data. For this purpose, the first multiplication and accumulation circuit 372_1 may perform a multiplication operation and an addition operation.

Likewise, the second multiplication and accumulation circuit 372_2 may generate second calculated data Data_ cal_2 by performing a multiplication operation and an addition operation by using the second input feature data IFD_2 and the second kernel data KND_2 and output the second calculated data Data_cal_2. For example, the second multiplication and accumulation circuit 372_2 may output the second calculated data Data_cal_2 in response to the output signal included in the internal arithmetic control signal iCTRL_Ari.

Likewise, the Nth multiplication and accumulation circuit 372_N may generate Nth calculated data Data_cal_N by performing a multiplication operation and an addition operation by using the Nth input feature data IFD_N and the Nth kernel data KND_N and output the Nth calculated data Data_cal_N. For example, the Nth multiplication and accumulation circuit 372_N may output the Nth calculated data Data_cal_N in response to the output signal included in the internal arithmetic control signal iCTRL_Ari.

The calculated data Data_cal may include at least one of the first calculated data Data_cal_1 to the Nth calculated data Data_cal_N.

Figure 8:
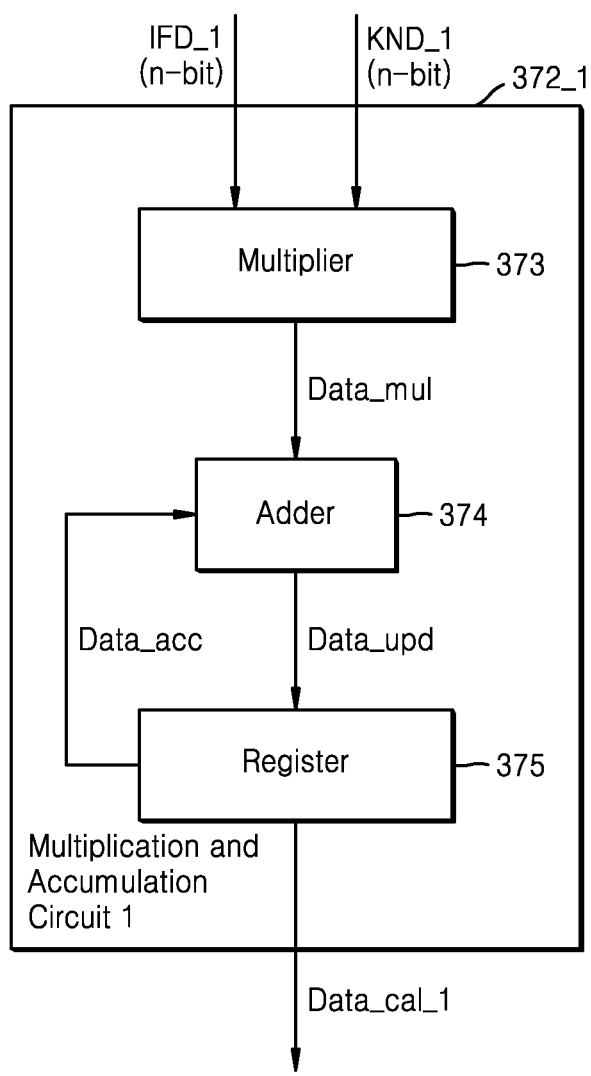
FIG. 8 illustrates a multiplication and accumulation circuit according to an exemplary embodiment of the inventive concept.

FIG. 8 illustrates a multiplication and accumulation circuit according to an exemplary embodiment of the inventive concept. For convenience of description, FIG. 8 illustrates the first multiplication and accumulation circuit 372_1 of FIG. 7. The second multiplication and accumulation circuit 372_2 to the Nth multiplication and accumulation circuit 372_N of FIG. 7 may also include a configuration illustrated in FIG. 8. Redundant descriptions about the first multiplication and accumulation circuit 372_1 with respect to FIG. 7 will be omitted for conciseness.

The first multiplication and accumulation circuit 372_1 includes a multiplier 373 (e.g., a multiplier circuit), an adder 374 (e.g., an adder circuit), and a register 375.

The multiplier 373 may generate multiplication data Data_mul by multiplying the first input feature data IFD_1 by the first kernel data KND_1 to generate multiplication data Data_mul and provide the multiplication data Data_mul to the adder 374.

The register 375 may temporarily store the calculated data. The register 375 may provide the stored calculated data to the adder 374 as accumulation data Data_acc.

The adder 374 may generate updated data Data_upd by adding the multiplication data Data_mul to the accumulation data Data_acc provided from the register 375. In other words, the adder 374 may update the calculated data by adding the multiplication data Data_mul to the calculated data provided by the register 375. The register 375 may output the calculated data as the first calculated data Data_cal_1 at a particular time. For example, when the output signal is input to the arithmetic circuit 370, the register 375 may output the first calculated data Data_cal_1.

As such, the first multiplication and accumulation circuit 372_1 may perform the multiplication operation by using the multiplier 373 and may accumulate the data by using the adder 374 and the register 375.

Figure 9:
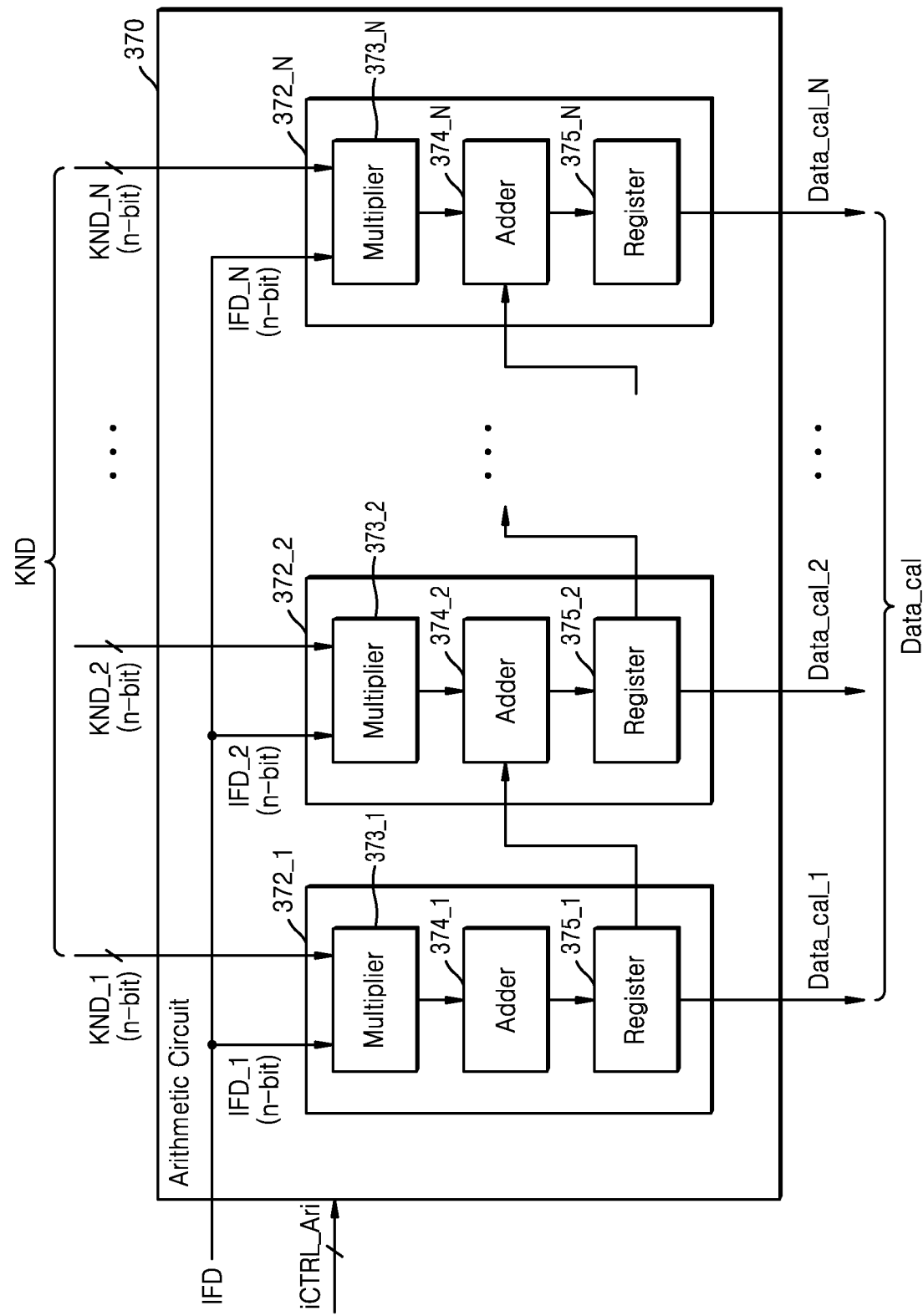
FIG. 9 illustrates an arithmetic circuit according to an exemplary embodiment of the inventive concept.

FIG. 9 illustrates an arithmetic circuit 370 according to an exemplary embodiment of the inventive concept. In comparison with FIG. 7, FIG. 9 illustrates an embodiment in which a plurality of multiplication and accumulation circuits are connected in a ring form. In an embodiment, although not illustrated in FIG. 9, an adder 374_1 of the first multiplication and accumulation circuit 372_1 also receives data from a register 375_N of the Nth multiplication and accumulation circuit 372_N.

A multiplier 373_1 of the first multiplication and accumulation circuit 372_1 may multiply the first input feature data IFD_1 by the first kernel data KND_1 to generate first multiplication data, an adder 374_1 of the first multiplication and accumulation circuit 372_1 may add the first multiplication data to a given initial value or the data provided from the register 375_N of the Nth multiplication and accumulation circuit 372_N to generate a first result value, and a register 375_1 may temporarily store the first result value and then provide the same to an adder 374_2 of the second multiplication and accumulation circuit 372_2.

A multiplier 373_2 of the second multiplication and accumulation circuit 372_2 may multiply the second input feature data IFD_2 by the second kernel data KND_2 to generate a second multiplication data, the adder 374_2 of the second multiplication and accumulation circuit 372_2 may add the second multiplication data to the data provided from the register 375_1 of the first multiplication and accumulation circuit 372_1 to generate a second result value, and a register 375_2 may temporarily store the second result value and then provide the same to an adder of the third multiplication and accumulation circuit.

In the case of a convolution operation, it may include an operation of multiplying and then summing a plurality of input feature data and a plurality of kernel data. Accordingly, since the arithmetic circuit 370 has a structure in which a plurality of multiplication and accumulation circuits are connected in a ring form, the second multiplication and accumulation circuit 372_2 may use the result calculated by the first multiplication and accumulation circuit 372_1 and the third multiplication and accumulation circuit may use the result calculated by the second multiplication and accumulation circuit 372_2 to perform the arithmetic operation.

The registers 375_1 to 375_N may output the calculated data Data_cal at a particular time. For example, when the output signal is input to the arithmetic circuit 370, the registers 375_1 to 375_N may output the calculated data Data_cal. The calculated data Data_cal may include at least one of the first calculated data Data_cal_1 to the Nth calculated data Data_cal_N.

Figure 10:
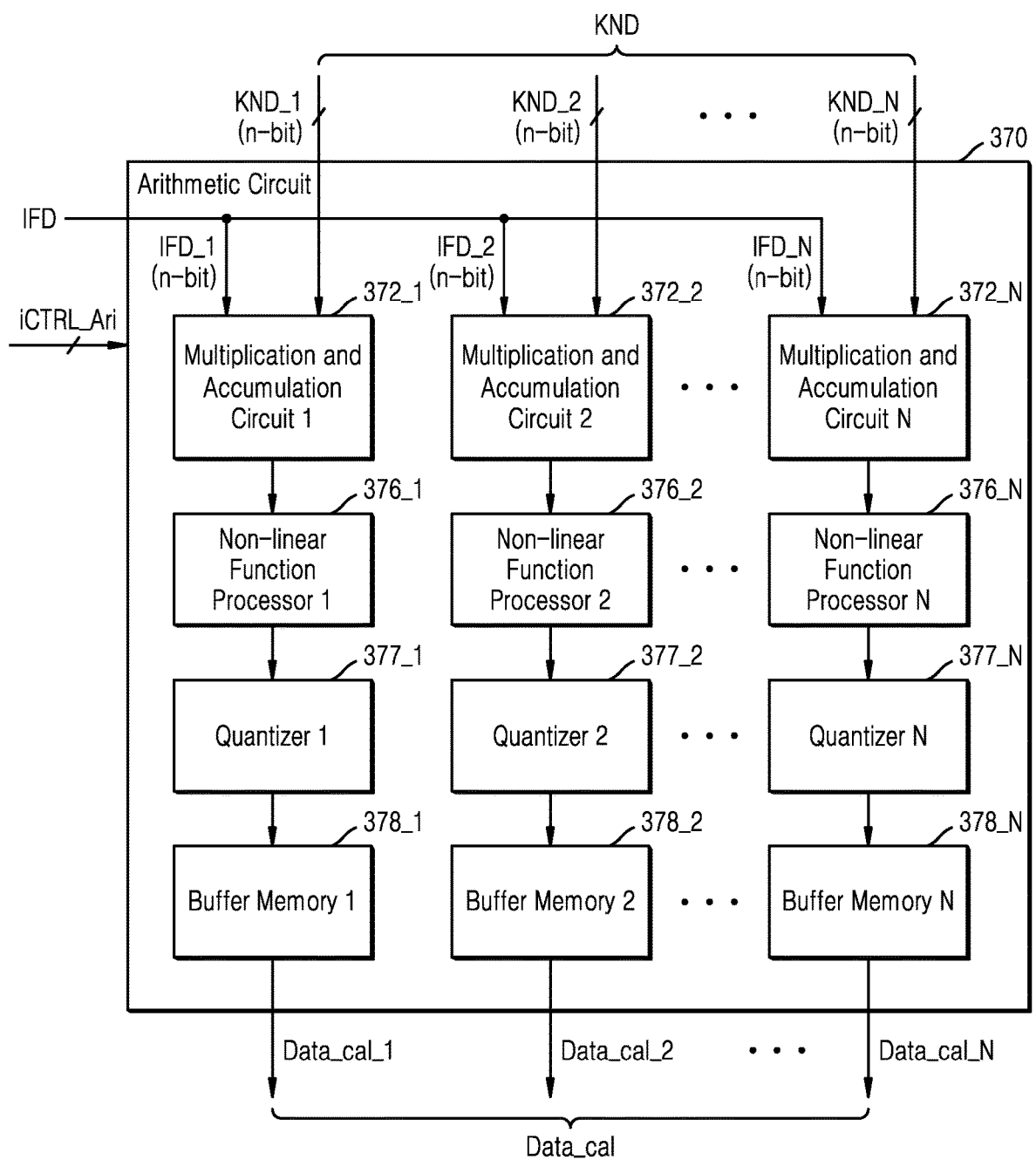
FIG. 10 illustrates an arithmetic circuit according to an exemplary embodiment of the inventive concept.

FIG. 10 illustrates an arithmetic circuit 370 according to an exemplary embodiment of the inventive concept. In comparison with FIG. 7, FIG. 10 illustrates an embodiment in which the arithmetic circuit 370 further includes a plurality of nonlinear function processors 376_1 to 376_N, a plurality of quantizers 377_1 to 377_N, and a plurality of buffer memories 378_1 to 378_N.

The first nonlinear function processor 376_1 executes a nonlinear function on the data multiplied and accumulated by the first multiplication and accumulation circuit 372_1. For example, the nonlinear function may include functions such as a sigmoid function, a hyperbolic tangent function, and a rectified linear unit function (ReLU). The first nonlinear function processor 376_1 may provide the nonlinear function processed data to the first quantizer 377_1 by executing a nonlinear function on the data provided by the first multiplication and accumulation circuit 372_1.

The data input to the first quantizer 377_1 may be 2n-bit data or (2n+1)-bit data. The first quantizer 377_1 may quantize 2n-bits data by n-bit data. In an exemplary embodiment, the first quantizer 377_1 performs a truncation or rounding operation on data it receives. In an exemplary embodiment, the first quantizer 377_1 converts 2n-bit data into n-bit data using the truncation or rounding operation.

The data quantized by the first quantizer 377_1 may be temporarily stored in the first buffer memory 378_1 and sequentially output as the first calculated data Data_cal_1.

The second nonlinear function processor 376_2 to the Nth nonlinear function processor 376_N may be understood as operating similarly to the first nonlinear function processor 376_1, the second quantizer 377_2 to the Nth quantizer 377_N may be understood as operating similarly to the first quantizer 377_1, and the second buffer memory 378_2 to the Nth buffer memory 378_N may be understood as operating similarly to the first buffer memory 378_1.

The calculated data Data_cal output by the arithmetic circuit 370 may include at least one of the first calculated data Data_cal_1 to the Nth calculated data Data_cal_N.

Figure 11:
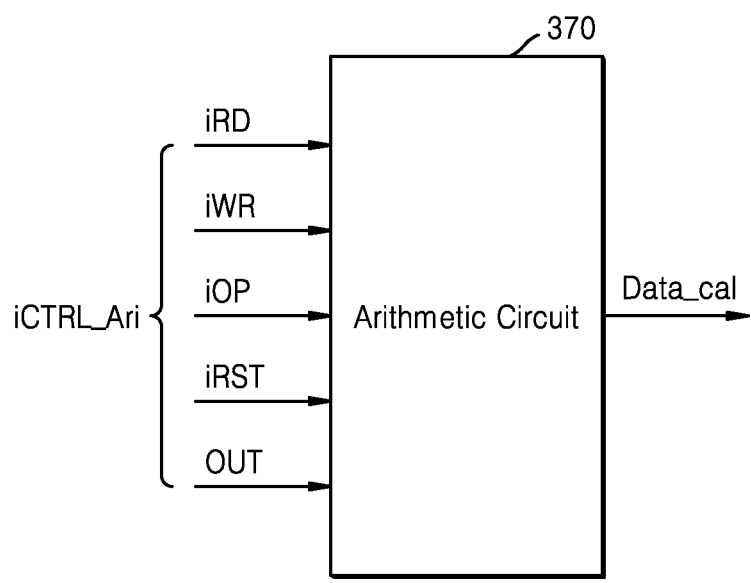
FIG. 11 illustrates an arithmetic circuit and an internal arithmetic control signal according to an exemplary embodiment of the inventive concept.

FIG. 11 illustrates an arithmetic circuit 370 and an internal arithmetic control signal iCTRL_Ari according to an exemplary embodiment of the inventive concept. FIG. 11 will be described with reference to FIG. 5.

The internal arithmetic control signal iCTRL_Ari may be generated in the memory device 300. For example, the internal arithmetic control signal iCTRL_Ari may be generated by the control logic 360 of the memory device 300. In an embodiment, the control logic 360 generates the internal arithmetic control signal iCTRL_Ari based on the arithmetic control signal CTRL_Ari provided by the memory controller 200 located outside the memory device 300.

In an exemplary embodiment, the internal arithmetic control signal iCTRL_Ari includes an internal read signal iRD and an internal write signal iWR. In an exemplary embodiment, the internal arithmetic control signal iCTRL_Ari includes at least one of an arithmetic operation start signal iOP, an arithmetic initialization signal iRST, and an output signal OUT.

In an exemplary embodiment, when the internal read signal iRD is received by the arithmetic circuit 370, the memory device 300 transmits the operand used in the arithmetic operation of the arithmetic circuit 370 from the memory bank 310 to the arithmetic circuit 370 through a path including the input/output sense amplifier 350. In other words, the memory device 300 reads the operand from the memory bank 310 to the arithmetic circuit 370 based on the internal read signal iRD. Unlike in a general read operation in which the data stored in the memory cell is transmitted to the outside of the memory device 300 through the data input/output buffer, in an internal read operation, the data stored in the memory cell is read only to the arithmetic circuit 370.

In an exemplary embodiment, when the internal write signal iWR is received by the arithmetic circuit 370, the memory device 300 transmits the operand used in the arithmetic operation of the arithmetic circuit 370 from outside the memory device 300 to the arithmetic circuit 370 through a path including the data input/output buffer. In other words, the memory device 300 writes the operand from outside the memory device 300 to the arithmetic circuit 370 based on the internal write signal iWR. Unlike in a general write operation in which the external data is transmitted to the memory cell, in an internal write operation, the external data is written only to the arithmetic circuit 370.

In an exemplary embodiment, when the arithmetic operation start signal iOP is received by the arithmetic circuit 370, the arithmetic circuit 370 starts the performance of an arithmetic operation by using a plurality of operands. For example, the arithmetic circuit 370 may start performing all or some of the convolution operations on the input feature data and the kernel data based on the arithmetic operation start signal iOP.

In an exemplary embodiment, when the operation initialization signal iRST is received by the arithmetic circuit 370, the arithmetic circuit 370 is initialized. For example, based on the operation initialization signal iRST, the temporary data stored in the registers included in the arithmetic circuit 370 may be erased.

In an exemplary embodiment, when the output signal OUT is received by the arithmetic circuit 370, the arithmetic circuit 370 outputs the calculated data Data_cal. In other words, the output signal OUT may control the arithmetic circuit 370 to output the calculated data Data_cal.

As described above, in order for the arithmetic circuit 370 to perform arithmetic operations by using the operands, the memory device 300 may generate the internal arithmetic control signal iCTRL_Ari.

Figure 12:
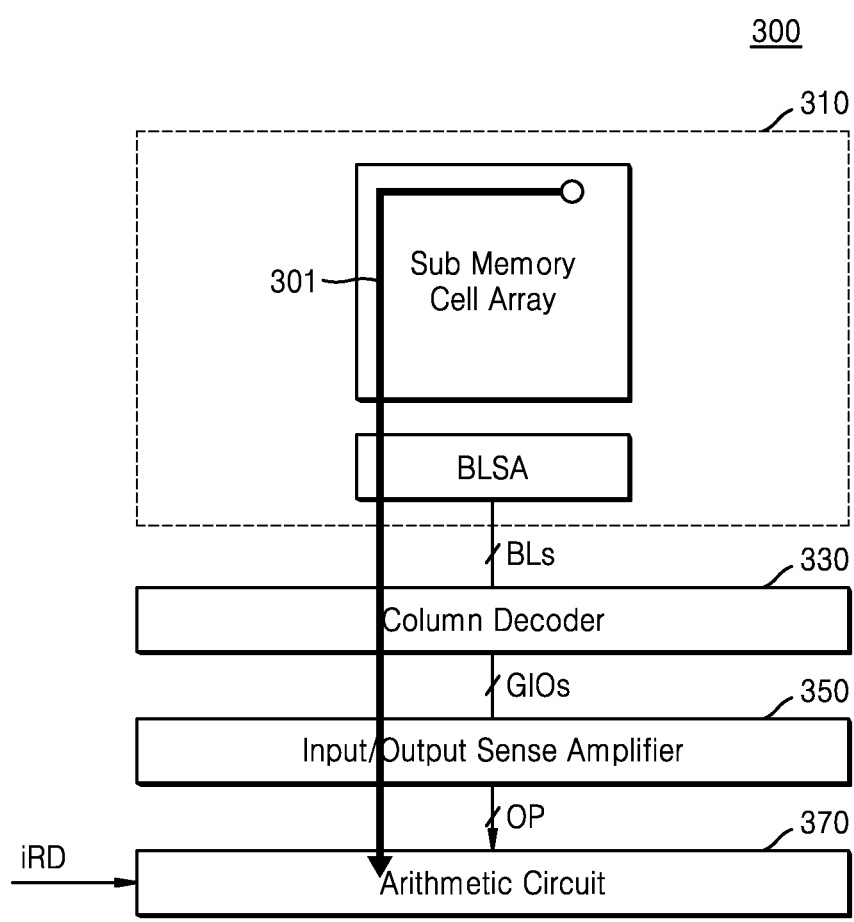
FIG. 12 illustrates configurations of a memory device for describing an internal read operation according to an exemplary embodiment of the inventive concept.

FIG. 12 illustrates configurations of a memory device 300 for describing an internal read operation according to an exemplary embodiment of the inventive concept. The memory device 300 includes a memory bank 310, a column decoder 330, an input/output sense amplifier 350, and an arithmetic circuit 370. Redundant descriptions about the memory device 300 with respect to the descriptions with reference to FIGS. 1 to 12 will be omitted for conciseness. FIG. 12 will be described with reference to FIG. 5.

The control logic 360 may generate an internal read signal iRD based on the arithmetic control signal CTRL_Ari received from the outside.

When the arithmetic circuit 370 receives the internal read signal iRD, the memory device 300 reads an operand OP from the memory bank 310 to the arithmetic circuit 370 through a path including the input/output sense amplifier 350. In other words, the transmission path of the operand OP may be identical to a first path 301. In other words, data is not transmitted to the outside of the memory device 300 according to the internal read operation.

Figure 13:
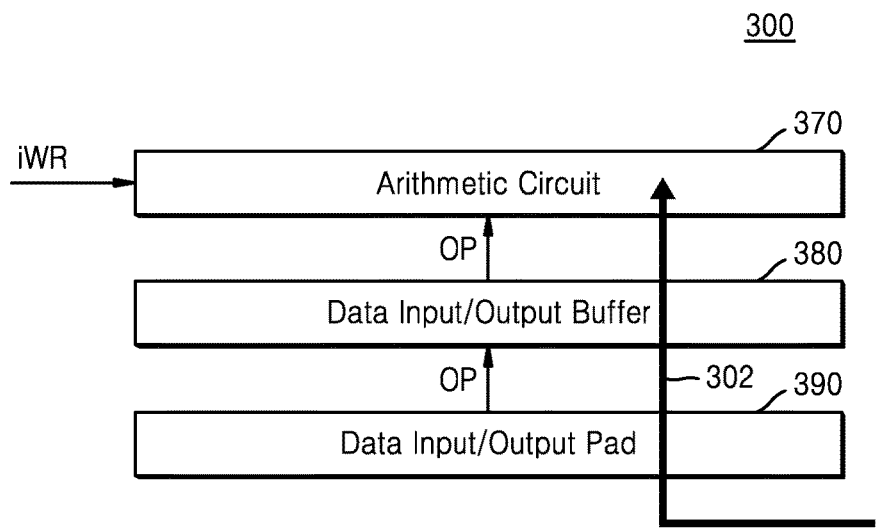
FIG. 13 illustrates configurations of a memory device for describing an internal write operation according to an exemplary embodiment of the inventive concept.

FIG. 13 illustrates configurations of a memory device 300 for describing an internal write operation according to an exemplary embodiment of the inventive concept. The memory device 300 includes an arithmetic circuit 370, a data input/output buffer 380, and a data input/output pad 390. Redundant descriptions about the memory device 300 with respect to the descriptions with reference to FIGS. 1 to 12 will be omitted for conciseness. FIG. 13 will be described with reference to FIG. 5.

The control logic 360 generates an internal write signal iWR based on the arithmetic control signal CTRL_Ari received from the outside.

When the arithmetic circuit 370 receives the internal write signal iWR, the memory device 300 transmits an operand OP from outside the memory device 300 to the arithmetic circuit 370 through a path including the data input/output pad 390 and the data input/output buffer 380. In other words, the transmission path of the operand OP may be identical to a second path 302. In other words, data is not transmitted to the memory cell of the memory device 300 according to the internal write operation.

Figure 14:
FIG. 14 illustrates an internal arithmetic control signal according to an exemplary embodiment of the inventive concept.

FIG. 14 illustrates an internal arithmetic control signal iCTRL_Ari according to an exemplary embodiment of the inventive concept. The internal arithmetic control signal iCTRL_Ari may include an internal read signal iRD, an internal write signal iWR, and an arithmetic operation start signal iOP.

In an embodiment, two or more of the internal read signal iRD, the internal write signal iWR, and the arithmetic operation start signal iOP are generated simultaneously.

Since the first path 301 that is the transfer path of data in the internal read operation according to the internal read signal iRD of FIG. 12 and the second path 302 that is the transfer path of data in the internal write operation according to the internal write signal iWR of FIG. 13 do not overlap each other, the internal read signal iRD and the internal write signal iWR may be generated simultaneously unlike the general read command and write command.

In an embodiment, as in FIG. 12, when the internal read signal iRD, the internal write signal iWR, and the arithmetic operation start signal iOP are activated simultaneously, the arithmetic circuit may perform the arithmetic operation in a shorter time.

Figure 15:
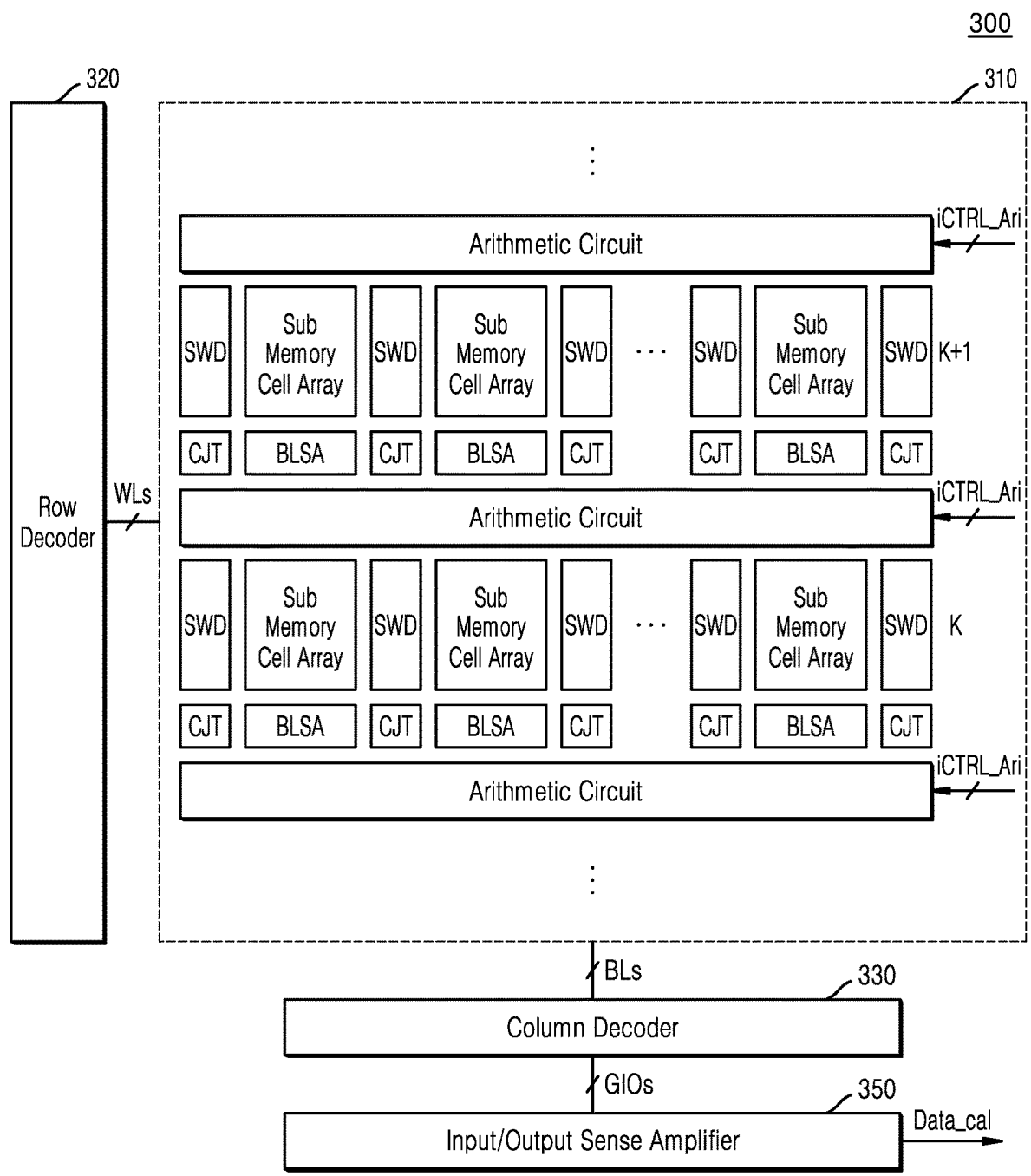
FIG. 15 illustrates a memory device according to an exemplary embodiment of the inventive concept.

FIG. 15 illustrates a memory device 300 according to an exemplary embodiment of the inventive concept. Redundant descriptions about the memory device 300 of FIG. 15 with respect to FIGS. 1, 2, and 5 will be omitted for conciseness. FIG. 15 will be described mainly on the difference from FIG. 6.

The arithmetic circuit may be arranged in a region where the bit line sense amplifier (BLSA) is arranged. In other words, the memory device 300 may include a plurality of arithmetic circuits, and the plurality of arithmetic circuits may be included in the memory bank 310 and may be repeatedly arranged between a plurality of sub memory cell arrays. The plurality of arithmetic circuits may receive a signal amplified by the bit line sense amplifiers as an operand and perform an arithmetic operation by using the operand.

The operation speed of the memory device 300 may further increase when the arithmetic circuits are arranged in the region where the bit line sense amplifier is arranged to perform the arithmetic operation.

Figure 16:
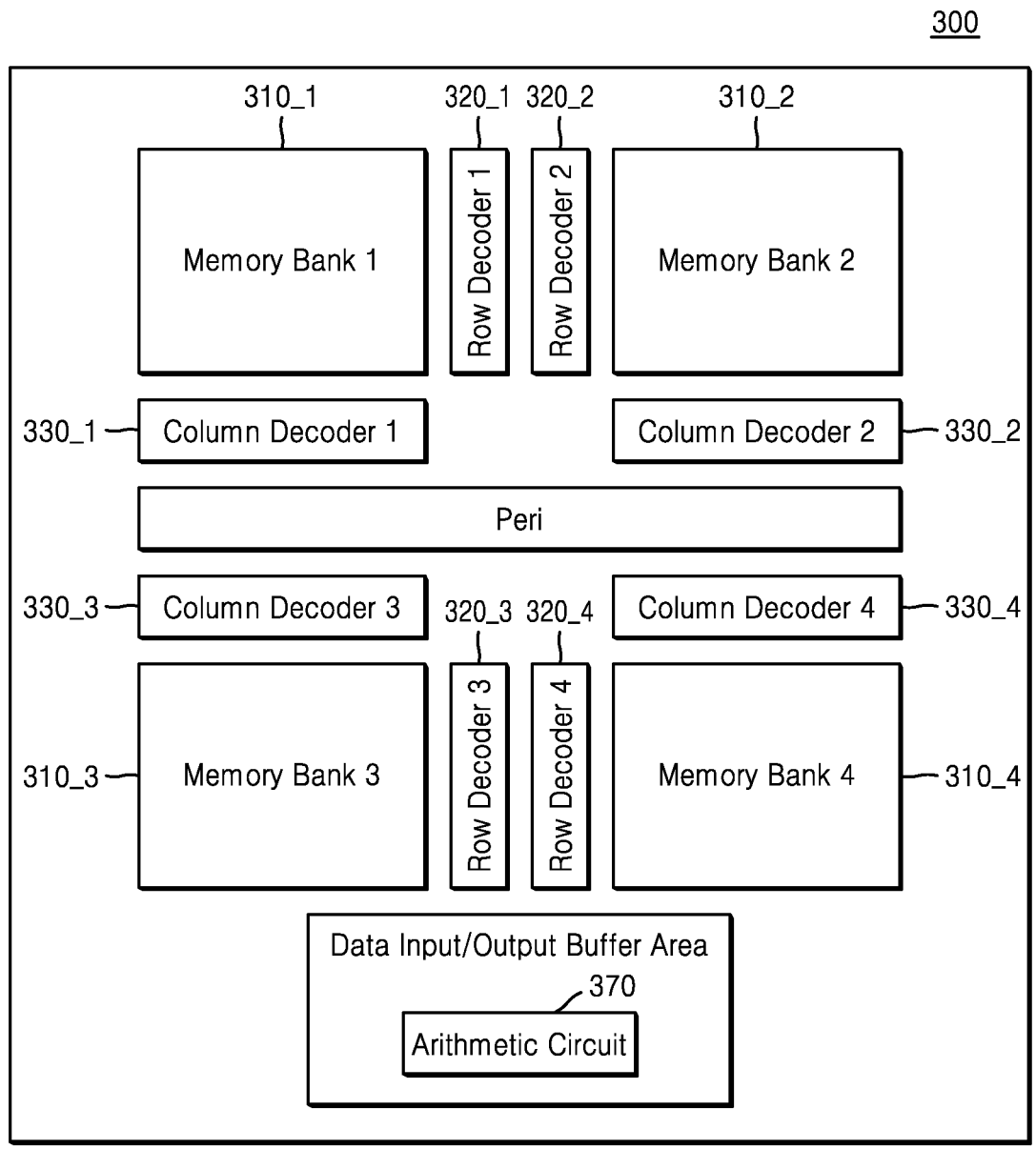
FIG. 16 illustrates a structure of a memory device according to an exemplary embodiment of the inventive concept.

FIG. 16 illustrates a structure of a memory device 300 according to an exemplary embodiment of the inventive concept. In an embodiment, FIG. 16 may represent the structure of the memory device 300 implemented as an MRAM. The memory device 300 includes a first memory bank 310_1 to a fourth memory bank 310_4, a first row decoder 320_1 to a fourth row decoder 320_4, a first column decoder 330_1 to a fourth column decoder 330_4, and an arithmetic circuit 370. Also, the memory device 300 may include a peri region where peripheral circuits are arranged and a data input/output buffer region where a data input/output buffer is located. The number of memory banks, the number of row decoders, the number of column decoders, and the detailed arrangement configuration thereof are merely examples and are not limited to the structure of FIG. 16.

In an exemplary embodiment, at least some of the memory cells included in the first memory bank 310_1 to the fourth memory bank 310_4 are implemented as an MRAM.

The arithmetic circuit 370 may be arranged in the data input/output buffer region. The arithmetic circuit 370 may be electrically connected to the first column decoder 330_1 to the fourth column decoder 330_4 to obtain an operand necessary for an arithmetic operation from the first memory bank 310_1 to the fourth memory bank 310_4 and may perform the arithmetic operation by using the operand. For example, the arithmetic circuit 370 may perform all or some of the convolution operations by using input feature data and the kernel data. For this purpose, the arithmetic circuit 370 may include a plurality of multiplication and accumulation circuits. Also, in an embodiment, the plurality of multiplication and accumulation circuits included in the arithmetic circuit 370 may be arranged in a matrix form.

The amount of data transmitted/received by the memory device 300 may be reduced because the arithmetic circuit 370 performs all or some of the convolution operations.

Figure 17:
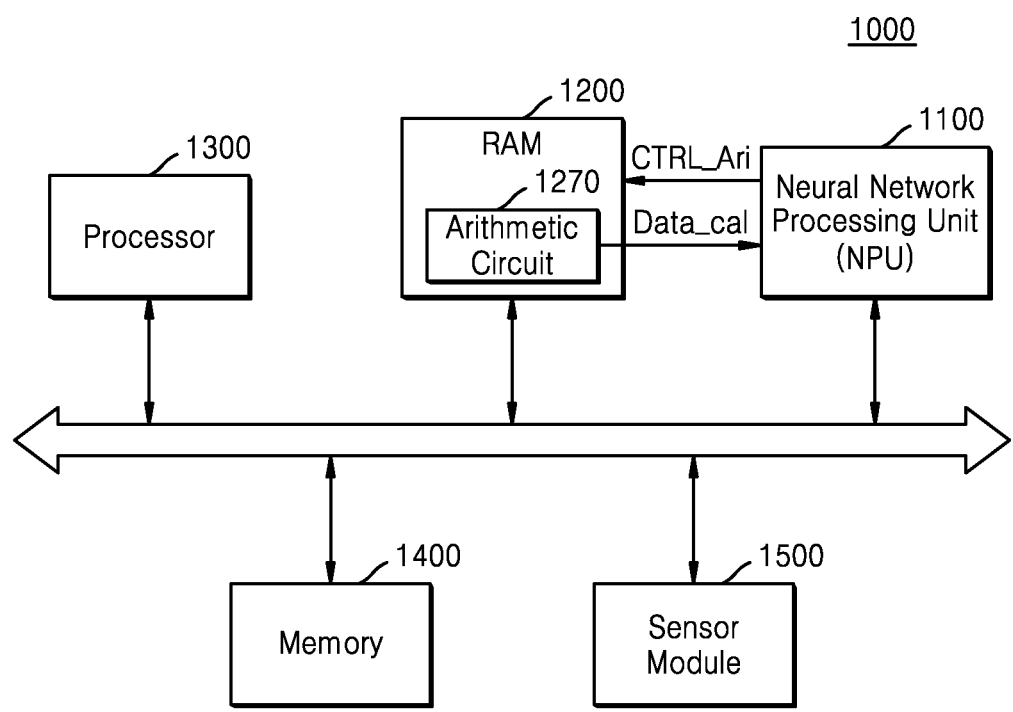
FIG. 17 illustrates an electronic system according to an exemplary embodiment of the inventive concept.

FIG. 17 illustrates an electronic system 1000 according to an exemplary embodiment of the inventive concept. The electronic system 1000 includes a neural network processing unit 1100, a random access memory (RAM) 1200, a processor 1300, a memory 1400, and a sensor module 1500. The neural network processing unit 1100 may correspond to the neural network processor 400 of FIG. 2, and the RAM 1200 may correspond to the memory device 300 of FIG. 2.

The electronic system 1000 may be applied to a drone, a robotic apparatus such as an advanced driver assistance system (ADAS), a smart TV, a smart phone, a medical device, a mobile device, an image display device, a measurement device, or an Internet of Things (IoT) device and may also be mounted on one of various other types of electronic devices.

A technique for connecting the components included in the electronic system 1000 may include a connection method based on a system bus. For example, the Advanced Microcontroller Bus Architecture (AMBA) protocol of Advanced RISC Machine (ARM) Inc. may be applied as the standard of the system bus. The bus types of the AMBA protocol may include Advanced High-Performance Bus (AHB), Advanced Peripheral Bus (APB), Advanced eXtensible Interface (AXI), AXI4, and AXI Coherency Extensions (ACE). Among the above bus types, AXI may be an interface protocol between IPs and may provide a multiple outstanding address function and a data interleaving function. In addition, other types of protocols such as uNetwork of SONICs Inc., CoreConnect of IBM Inc., and Open Core Protocol of OCP-IP may also be applied to the system bus.

The RAM 1200 may temporarily store programs, data, or commands (instructions). For example, the programs and/or data stored in the memory 1400 may be temporarily loaded into the RAM 1200 according to a booting code or the control of the processor 1300. The RAM 1200 may be implemented by using a memory such as a dynamic RAM (DRAM) or a static RAM (SRAM).

The processor 1300 may control an overall operation of the electronic system 1000, and as an example, the processor 1300 may be a central processing unit (CPU). The processor 1300 may include a processor core or may include a plurality of processor cores (multi-core).

The processor 1300 may process or execute the programs and/or data stored in the RAM 1200 and the memory 1400. For example, the processor 1300 may control the functions of the electronic system 1000 by executing the programs stored in the memory 1400.

The memory 1400 may be a storage device for storing data and may store, for example, an operating system (OS), various programs, and various data. The memory 1400 may be a DRAM but is not limited thereto. The memory 1400 may include at least one of a volatile memory or a nonvolatile memory. The nonvolatile memory may include, for example, Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), and/or Ferroelectric RAM (FRAM). The volatile memory may include, for example, Dynamic RAM (DRAM), Static RAM (SRAM), Synchronous DRAM (SDRAM), Phase-change RAM (PRAM), Magnetic RAM (MRAM), Resistive RAM (RRAM), and/or Ferroelectric RAM (FeRAM). Also, in an embodiment, the memory 1400 may include at least one of Hard Disk Drive (HDD), Solid State Drive (SSD), Compact Flash (CF), Secure Digital (SD), Micro Secure Digital (Micro-SD), Mini Secure Digital (Mini-SD), extreme Digital (xD), and Memory Stick.

The sensor module 1500 may collect information about the electronic system 1000. The sensor module 1500 may sense or receive an image signal from outside the electronic system 1000 and may convert the sensed or received image signal into image data, that is, an image frame. For this purpose, the sensor module 1500 may include a sensing device, for example, at least one of various types of sensing devices such as cameras, imaging devices, image sensors, light detection and ranging (LIDAR) sensors, ultrasonic sensors, and infrared sensors or may receive a sensing signal from a sensing device. In an embodiment, the sensor module 1500 provides the image frame to the neural network processing unit 1100. For example, the sensor module 1500 may include an image sensor and may generate a video stream by capturing an image of the external environment of the electronic system 1000 and sequentially provide consecutive image frames of the video stream to the neural network processing unit 1100.

According to an exemplary embodiment of the inventive concept, the RAM 1200 includes an arithmetic circuit 1270. The arithmetic circuit 1270 may perform an arithmetic operation on operands based on an internal arithmetic control signal generated in the RAM 1200. For example, the arithmetic circuit 1270 may output calculated data Data_cal to the neural network processing unit 1100 by performing all or some of the convolution operations on the operands. The features described with reference to FIGS. 1 to 16 may be applied to a particular operation on the arithmetic circuit 1270.

Exemplary embodiments of the inventive concept have been described above with reference to the drawings. Although particular terms are used herein to describe the embodiments, they are merely used to describe the technical idea of the inventive concept and are not intended to limit the scope of the inventive concept. Therefore, those of ordinary skill in the art will understand that various modifications and other equivalent embodiments may be derived therefrom.

What is claimed is:

1. A memory device comprising:
   a memory bank including a plurality of memory cells arranged in a region where a plurality of word lines and a plurality of bit lines of the memory device intersect each other;
   a sense amplifier connected to the memory bank through the plurality of bit lines and configured to amplify a signal transmitted through selected bit lines from among the plurality of bit lines; and
   an arithmetic circuit,
   wherein the memory device generates an internal arithmetic control signal including an internal read signal and an internal write signal in response to receiving an external arithmetic control signal from a device located outside the memory device, reads a first operand from the sense amplifier to the arithmetic circuit in response to the internal read signal, writes a second operand received from the device located outside the memory device from a data input/output buffer of the memory device to the arithmetic circuit in response to the internal write signal, and
   wherein the arithmetic circuit performs an arithmetic operation by using the first operand and the second operand.

2. The memory device of claim 1, wherein the memory device reads the first operand from the memory bank to the arithmetic circuit through a path including the sense amplifier when the arithmetic circuit receives the internal read signal.

3. The memory device of claim 1, wherein the memory device writes the second operand received from outside the memory device to the arithmetic circuit through a path including the data input/output buffer of the memory device when the arithmetic circuit receives the internal write signal.

4. The memory device of claim 1, wherein the internal arithmetic control signal further includes at least one of an arithmetic operation start signal for starting the arithmetic operation of the arithmetic circuit, an arithmetic initialization signal for initializing the arithmetic circuit, and an output signal for controlling the arithmetic circuit to output calculated data.

5. The memory device of claim 4, wherein the memory device simultaneously generates two or more of the internal read signal, the internal write signal, and the arithmetic operation start signal.

6. The memory device of claim 1, wherein the internal arithmetic control signal is generated by control logic configured to control configurations of the memory device.

7. The memory device of claim 1, wherein the arithmetic circuit includes a multiplication and accumulation circuit configured to perform a multiplication operation and an accumulation operation by using the first operand and the second operand.

8. The memory device of claim 7, wherein the multiplication and accumulation circuit includes:
   a multiplier configured to generate multiplication data by multiplying the first operand by the second operand;
   a register configured to temporarily store calculation data; and
   an adder configured to update the calculation data by adding the multiplication data to the calculation data stored in the register.

9. The memory device of claim 7, wherein the arithmetic circuit further includes:
   a nonlinear function processor configured to perform nonlinear function processing on data calculated by the multiplication and accumulation circuit; and
   a quantizer configured to quantize the nonlinear function processed data.

10. The memory device of claim 7, wherein the arithmetic circuit includes a plurality of multiplication and accumulation circuits including the multiplication and accumulation circuit, and the plurality of multiplication and accumulation circuits are connected to each other in a ring form.

11. The memory device of claim 1, further comprising a column decoder connected to the memory bank through the plurality of bit lines and configured to perform a decoding operation to select some of the bit lines, wherein the sense amplifier includes an input/output sense amplifier connected to the column decoder through global input/output lines and configured to amplify a signal transmitted through the global input/output lines, and the arithmetic circuit is configured to receive the first operand from the input/output sense amplifier.

12. The memory device of claim 9, wherein the memory bank includes a plurality of sub memory cell arrays arranged in a matrix form along a direction of the plurality of word lines and the plurality of bit lines, the sense amplifier includes a plurality of bit line sense amplifiers, wherein each of the plurality of bit line sense amplifiers is connected to sub bit lines connected respectively to the plurality of sub memory cell arrays and is configured to amplify a signal transmitted through the sub bit lines, and the arithmetic circuit is included in the memory bank and is configured to receive the first operand from the plurality of bit line sense amplifiers.

13. A memory device comprising:
at least one memory bank including a plurality of memory cells;
control logic configured to generate an internal arithmetic control signal including an internal read signal and an internal write signal based on an external arithmetic control signal received from a processor located outside the memory device; and
an arithmetic circuit,
wherein the memory device reads a first operand to the arithmetic circuit from the at least one memory bank through an electrical path including a sense amplifier, in response to the internal read signal,
wherein the memory device writes a second operand received from the processor from a data input/output buffer of the memory device to the arithmetic circuit, in response to the internal write signal, and
wherein the arithmetic circuit performs an arithmetic operation by using the first operand and the second operand.

14. The memory device of claim 13, wherein one of input feature data and kernel data is input to the arithmetic circuit through an electrical path including the data input/output buffer of the memory device, in response to the internal write signal generated by the control logic.

15. The memory device of claim 13, wherein the internal arithmetic control signal further includes at least one of an arithmetic operation start signal for starting an arithmetic operation of the arithmetic circuit, an arithmetic initialization signal for initializing the arithmetic circuit, and an output signal for controlling the arithmetic circuit to output calculated data.

16. The memory device of claim 13, wherein the control logic is further configured to control the memory device to store at least one of the input feature data and kernel data in the memory bank by configuring an address of the memory bank to store at least one of the input feature data and the kernel data so that at least one of the input feature data and the kernel data is sequentially input to the arithmetic circuit based on the internal read signal.

17. The memory device of claim 13, wherein the memory bank comprises:
a plurality of sub memory cell arrays; and
bit line sense amplifiers connected to the plurality of sub memory cell arrays through sub bit lines and configured to amplify a signal transmitted through the sub bit lines, the memory device further comprises an input/output sense amplifier configured to amplify a signal transmitted through a global input/output line through a column decoder from the memory bank, and the arithmetic circuit is located in a region where the bit line sense amplifiers are arranged or in a region where the input/output sense amplifier is arranged.

18. A neural network system for performing a neural network operation, the neural network system comprising:
a neural network processor configured to generate an arithmetic control signal for controlling an arithmetic operation of a memory device; and
a memory device configured to generate an internal arithmetic control signal including an internal read signal and an internal write signal based on the arithmetic control signal provided from the neural network processor located outside the memory device, internally read a first operand from a sense amplifier of the memory device to an arithmetic circuit of the memory device when the internal read signal is generated, and internally write a second operand received from the neural network processor from a data input/output buffer of the memory device to the arithmetic circuit when the internal write signal is generated,
wherein the arithmetic circuit performs an arithmetic operation by using the first operand and the second operand.

19. The neural network system of claim 18, wherein the internal arithmetic control signal further includes an arithmetic operation start signal, and the arithmetic circuit is configured to:
read any one of input feature data and kernel data from a memory bank of the memory device through a path including the sense amplifier when the internal read signal is generated;
obtain the other one of the input feature data and the kernel data through the data input/output buffer through a path excluding the memory bank when the internal write signal is generated; and
perform an arithmetic operation by using the input feature data and the kernel data when the arithmetic operation start signal is generated.

* * * * *